US012627258B2

(12) United States Patent
Lee

(10) Patent No.: US 12,627,258 B2
(45) Date of Patent: May 12, 2026

(54) DUAL RESONATOR STRUCTURE FOR TEMPERATURE-COMPENSATED OSCILLATORS, INCLUDING RELATED APPARATUSES

(71) Applicant: Microchip Technology Incorporated, Chandler, AZ (US)

(72) Inventor: Seungbae Lee, San Jose, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 18/818,787

(22) Filed: Aug. 29, 2024

(65) Prior Publication Data

US 2025/0080049 A1 Mar. 6, 2025

Related U.S. Application Data

(60) Provisional application No. 63/580,247, filed on Sep. 1, 2023.

(51) Int. Cl.
*H03B 5/04* (2006.01)
*H03B 5/30* (2006.01)
*H03H 3/007* (2006.01)
*H03H 9/02* (2006.01)
*H03H 9/24* (2006.01)

(52) U.S. Cl.
CPC ................. *H03B 5/04* (2013.01); *H03B 5/30* (2013.01); *H03H 3/0076* (2013.01); *H03H 3/0077* (2013.01); *H03H 9/02448* (2013.01); *H03H 9/2431* (2013.01)

(58) Field of Classification Search
CPC ............. H03H 9/02448; H03H 9/2405; H03H 9/2431; H03H 3/0076; H03H 3/0077; H03B 5/04; H03B 5/30
See application file for complete search history.

(56) References Cited

U.S. PATENT DOCUMENTS

| | | | |
|---|---|---|---|
| 7,750,758 B2 | 7/2010 | Zhiyu et al. | |
| 10,247,621 B1 * | 4/2019 | Partridge ............. | H03K 3/0315 |
| 10,622,973 B1 | 4/2020 | Partridge et al. | |
| 2007/0290764 A1 | 12/2007 | Partridge et al. | |

(Continued)

FOREIGN PATENT DOCUMENTS

EP 2395660 A1 12/2011

OTHER PUBLICATIONS

International Search Report of International Application No. PCT/US2024/044334, mailed Dec. 16, 2024, 4 pages.

(Continued)

*Primary Examiner* — Ryan Johnson
(74) *Attorney, Agent, or Firm* — TraskBritt

(57) ABSTRACT

An apparatus comprises a micromechanical system including a semiconductor body. The semiconductor body comprises a first resonator, a second resonator, and a supporting portion. The first resonator is to resonate at a first resonating frequency that is generally frequency-stable over a predetermined temperature range. The second resonator is to resonate at a second resonating frequency that is generally linearly decreasing or increasing as temperature increases over the predetermined temperature range. The supporting portion is to support both the first resonator and the second resonator.

35 Claims, 13 Drawing Sheets

(56)                References Cited

U.S. PATENT DOCUMENTS

| | | | |
|---|---|---|---|
| 2009/0058561 A1* | 3/2009 | Pan | H03H 9/02338 |
| | | | 333/186 |
| 2011/0163819 A1* | 7/2011 | Badillo | H03F 3/45071 |
| | | | 327/246 |
| 2019/0097600 A1 | 3/2019 | Yoshii et al. | |
| 2020/0220549 A1 | 7/2020 | Oja et al. | |

OTHER PUBLICATIONS

Rodriguez, J. et al., Damping Mechanisms in Light and Heavy-Doped Dual-Ring and Double-Ended Tuning Fork Resonators (DETF), 2015 Transducers, 2015 18th International Conference on Solid-State Sensors, Actuators and Microsystems (Transducers), IEEE, Jun. 21, 2015, pp. 2005-2008.

Written Opinion of the International Searching Authority of International Application No. PCT/US2024/044334, mailed Dec. 16, 2024, 9 pages.

DualMEMS and Turbo Compensation Temperature Sensing Technology, SiTime Corporation, Sep. 2018, 6 pages.

Melamud, R et al., Mems Enables Oscillators With Sub-Ppm Frequency Stability and Sub-Ps Jitter, SiTime Corporation, Solid-State Sensors, Actuators and Microsystems Workshop, Hilton Head Island, South Carolina, Jun. 3-7, 2012, pp. 66-69.

Pensala, T et al., Temperature Compensation of Silicon MEMS Resonators by Heavy Doping, 2011 IEEE International Ultrasonics Symposium Proceedings, pp. 1952-1955.

ROM7050PA Mercury+ Tm Ic Ocxo | 5G Rrhs and Small Cells, Rakon Limited, Aug. 31, 2023, 2 pages.

Roshan, M. H et al., A MEMS-Assisted Temperature Sensor With 20-uK Resolution, Conversion Rate of 200 S/s, and FOM of 0.04 pJK2, IEEE Journal of Solid-State Circuits, vol. 52, No. 1, Jan. 2017, pp. 185-197.

SiT5357 60-220 MHZ, +0.1 to +0.25 ppm, Stratum 3, Elite Platform™ Precision Super-TCXO, Rev 1.03, SiTime Corporation, Aug. 2, 2018, 35 pages.

Salvia, James C., et al. "Real-time temperature compensation of MEMS oscillators using an integrated micro-oven and a phase-locked loop." Journal of Microelectromechanical Systems 19.1 (2009): 192-201. (Year: 2009).

Campanella Humberto et al: "Dual MEMS Resonator Structure for Temperature Sensor Applications", IEEE Transactions On Electron Devices, IEEE, USA, vol. 64, No. 8, Aug. 28, 2017 (Aug. 28, 2017), pp. 3368-3376, XP011657254, ISSN: 0018-9383, DOI: 10.1109/TED.2017.2708129.

Fei Sitao et al: "Temperature Characteristics of a Contour Mode MEMS AlN Piezoelectric Ring Resonator on SOI Substrate", Micromachines (Basel), [Online] vol. 12, No. 2, Jan. 29, 2021 (Jan. 29, 2021), pp. 1-13, XP093342143, Switzerland ISSN: 2072-666X, DOI: 10.3390/mi12020143 Retrieved from the Internet: URL:https://www.mdpi.com/2072-666X/12/2/14 3/pdf>.

Heidarpour Roshan Meisam et al: "A MEMS-Assisted Temperature Sensor With 20-μK Resolution, Conversion Rate of 200 S/s, and FOM of 0.04 pJK$^2$", IEEE Journal of Solid-State Circuits, IEEE, USA, vol. 52, No. 1, Jan. 28, 2017 (Jan. 28, 2017), pp. 185-197, XP011638637, ISSN: 0018-9200, DOI: 10.1109/JSSC.2016.2621035.

International Search Report of International Application No. PCT/US2024/044335, mailed Jan. 2, 2026, 4 pages.

Written Opinion of the International Searching Authority of International Application No. PCT/US2024/044335, mailed Jan. 2, 2026, 9 pages.

Wu Zhengzheng et al: "A temperature-stable mems oscillator on an ovenized micro-platform using a PLL-based heater control system", 2015 28th IEEE International Conference on Micro Electro Mechanical Systems (MEMS), IEEE, Jan. 18, 2015 (Jan. 18, 2015), pp. 793-796, XP032740888, DOI: 10.1109/MEMSYS.2015.7051078.

* cited by examiner

1

DUAL RESONATOR STRUCTURE FOR TEMPERATURE-COMPENSATED OSCILLATORS, INCLUDING RELATED APPARATUSES

CROSS-REFERENCE TO RELATED APPLICATIONS

This application claims the benefit under 35 U.S.C. § 119 (e) of U.S. Provisional Patent Application No. 63/580,247, filed Sep. 1, 2023, and titled "Dual Resonator Structure for Temperature-Compensated Oscillators," the entire disclosure of which is hereby incorporated herein by reference. The subject matter of this application is also related to U.S. patent application Ser. No. 18/818,810, filed Aug. 29, 2024, the entire disclosure of which is hereby incorporated herein by reference.

TECHNICAL FIELD

Examples relate, generally, to resonators for timing applications. More specifically, some examples relate to microelectromechanical (MEMS) resonators for temperature-compensated oscillators, without limitation.

BACKGROUND

Mechanically vibrating devices are used in communication systems, as well as other systems that require a frequency reference, in a variety of applications and operational contexts. Although quartz-based resonant devices and other acoustic devices are widely used in electronic systems, traditional quartz crystal oscillators are relatively large in comparison to other components in these systems. This is especially true in applications where miniaturization is required. Due to their mechanical nature and specific fabrication processes, these devices may be more challenging to integrate with their associated electronic circuitry. Some integrated circuits (ICs) with precise timing requirements rely on an external crystal or a crystal oscillator module. On the other hand, silicon-based microelectromechanical systems (MEMS) are attractive for use as compact, single-chip integrated or directly integrated frequency references.

BRIEF DESCRIPTION OF THE DRAWINGS

While this disclosure concludes with claims particularly pointing out and distinctly claiming specific examples, various advantages of examples within the scope of this disclosure may be more readily ascertained from the following description when read in conjunction with the accompanying drawings, in which:

2

Figure 2:
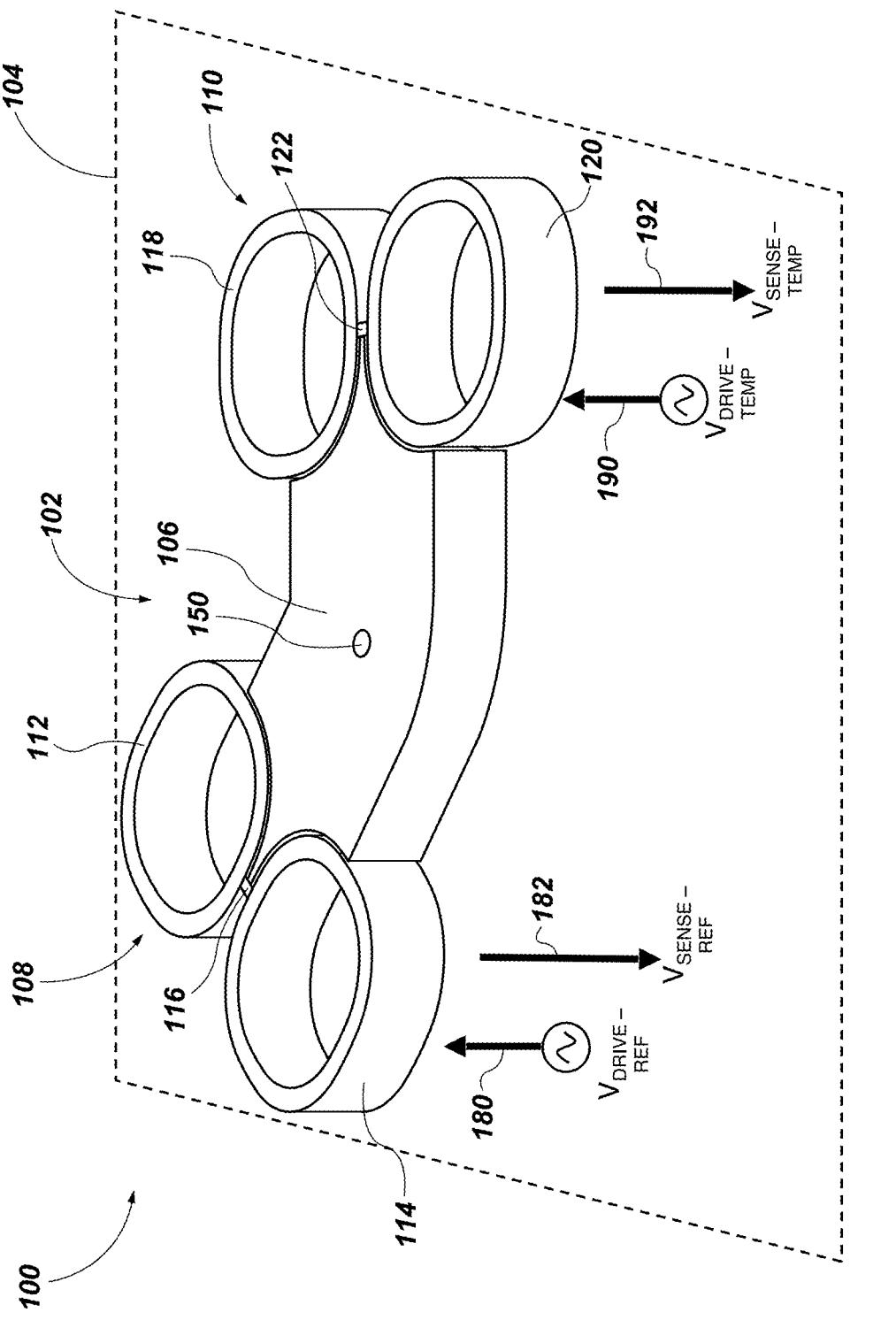
FIG. 2 is a perspective view of an example of the apparatus of FIG. 1, where respective ones of the first resonator and the second resonator comprise a dual-ring resonator having first and second rings, according to one or more examples.
Figure 3:
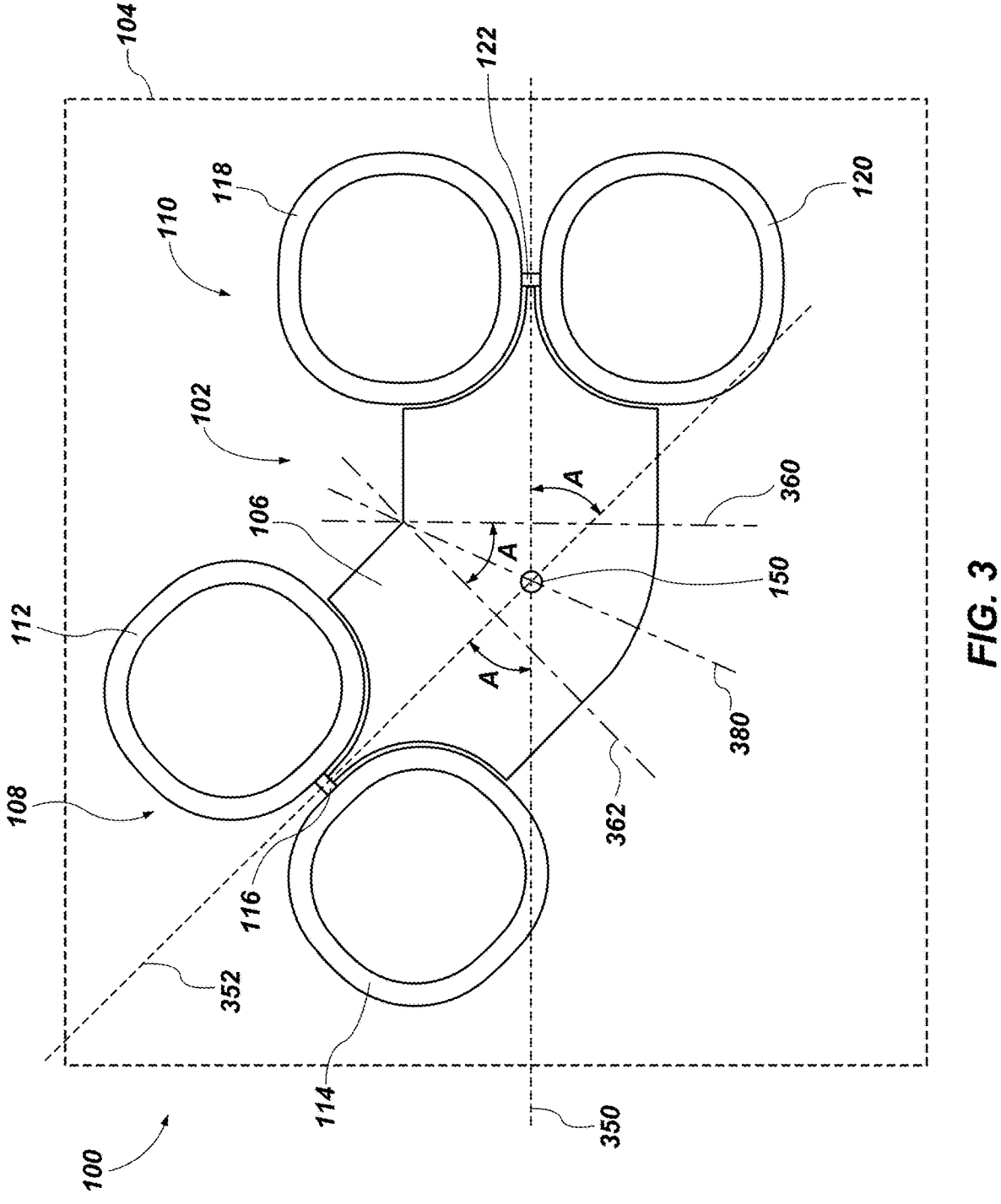
FIG. 3 is a top-down view of the apparatus of FIG. 2, according to one or more examples.
Figures 4A, 4B:
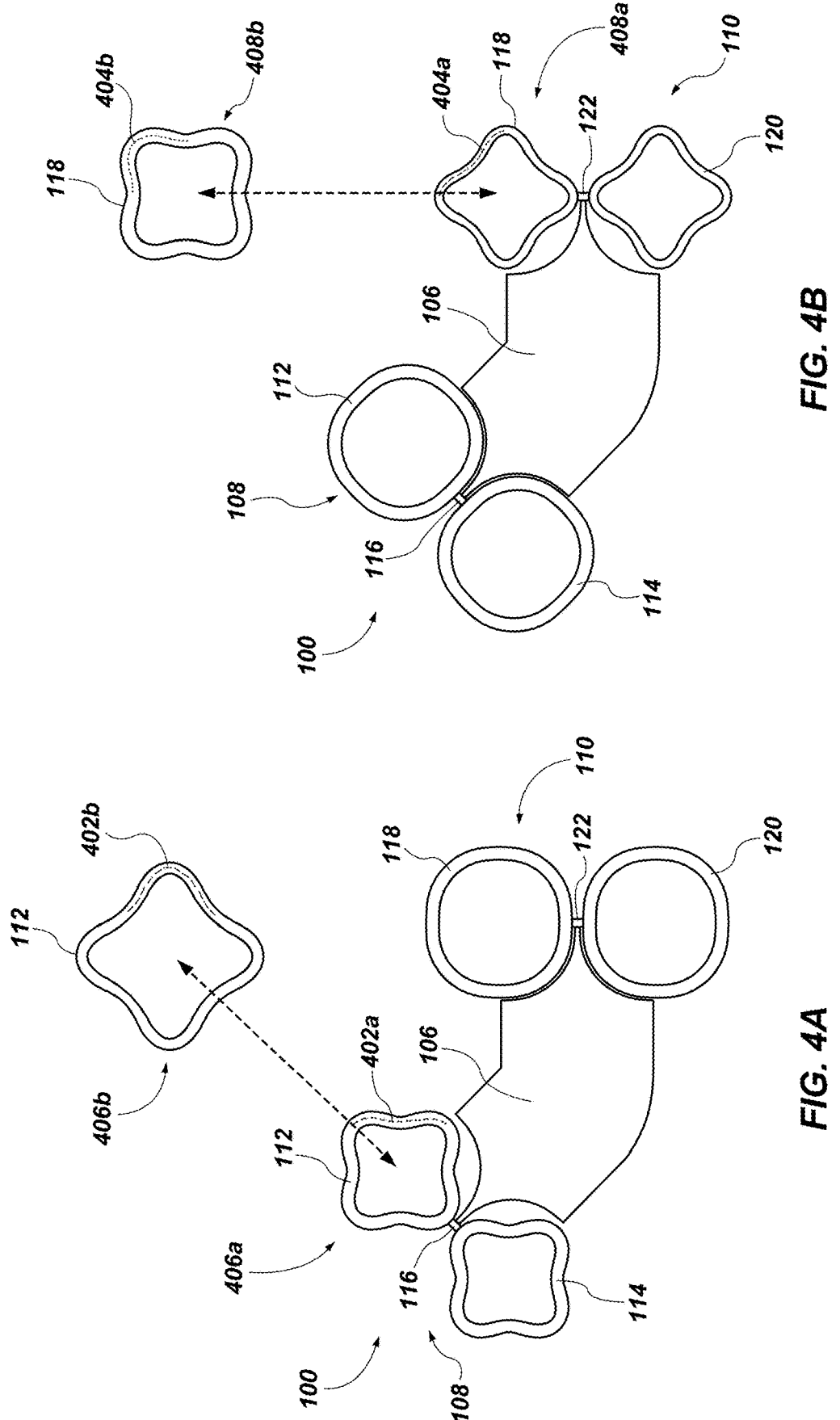
Figure 5A:
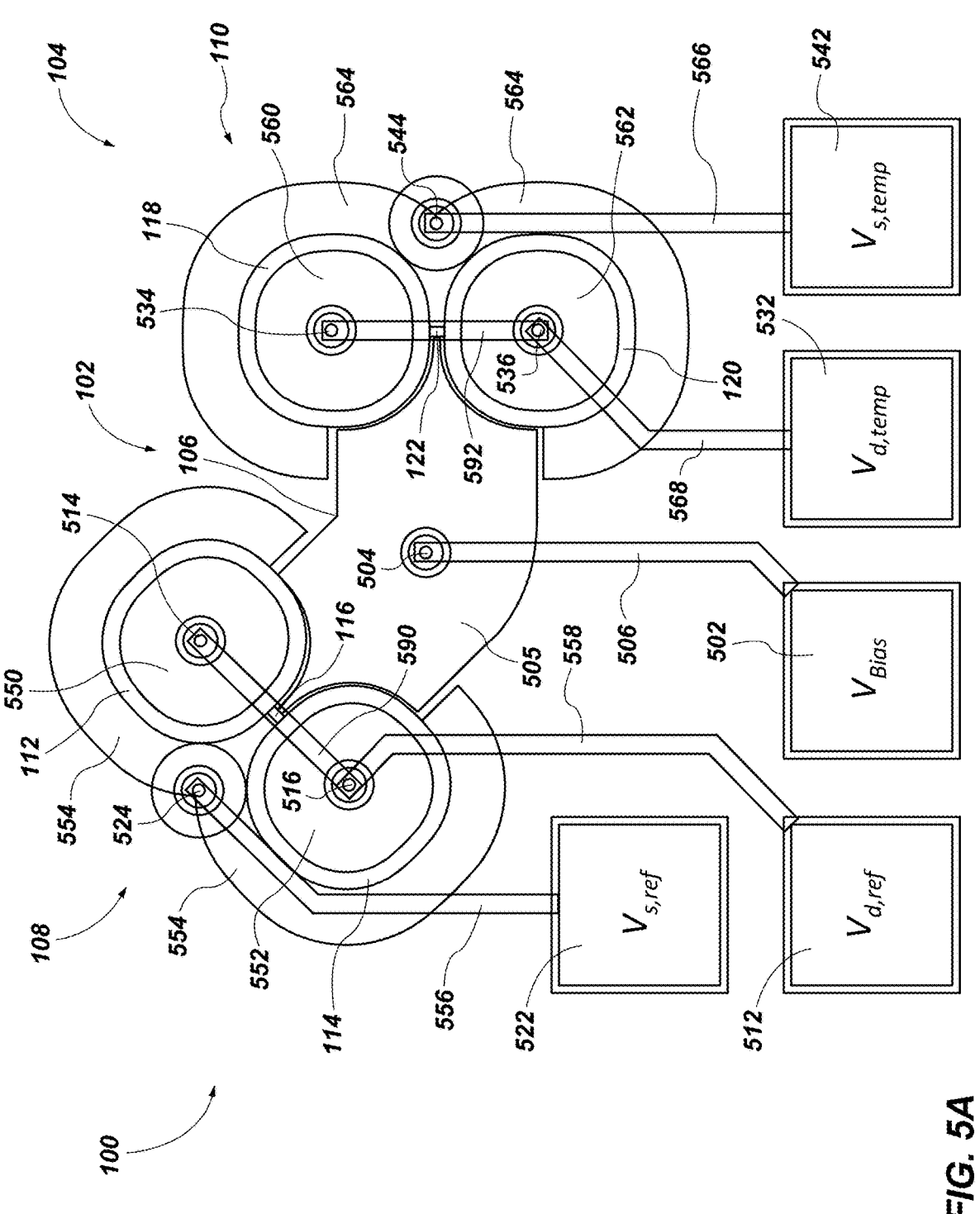
Figure 5B:
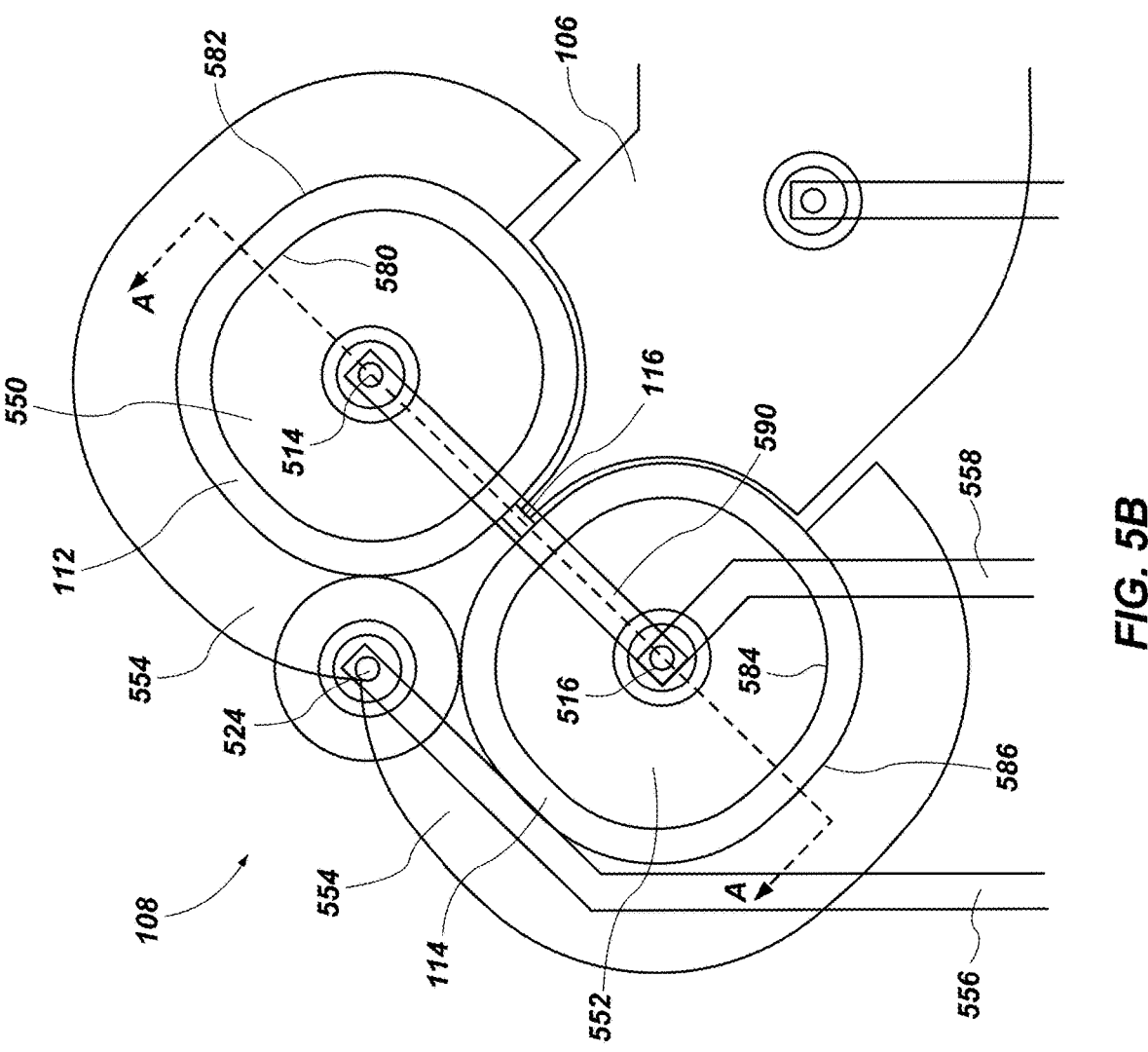
Figure 6:
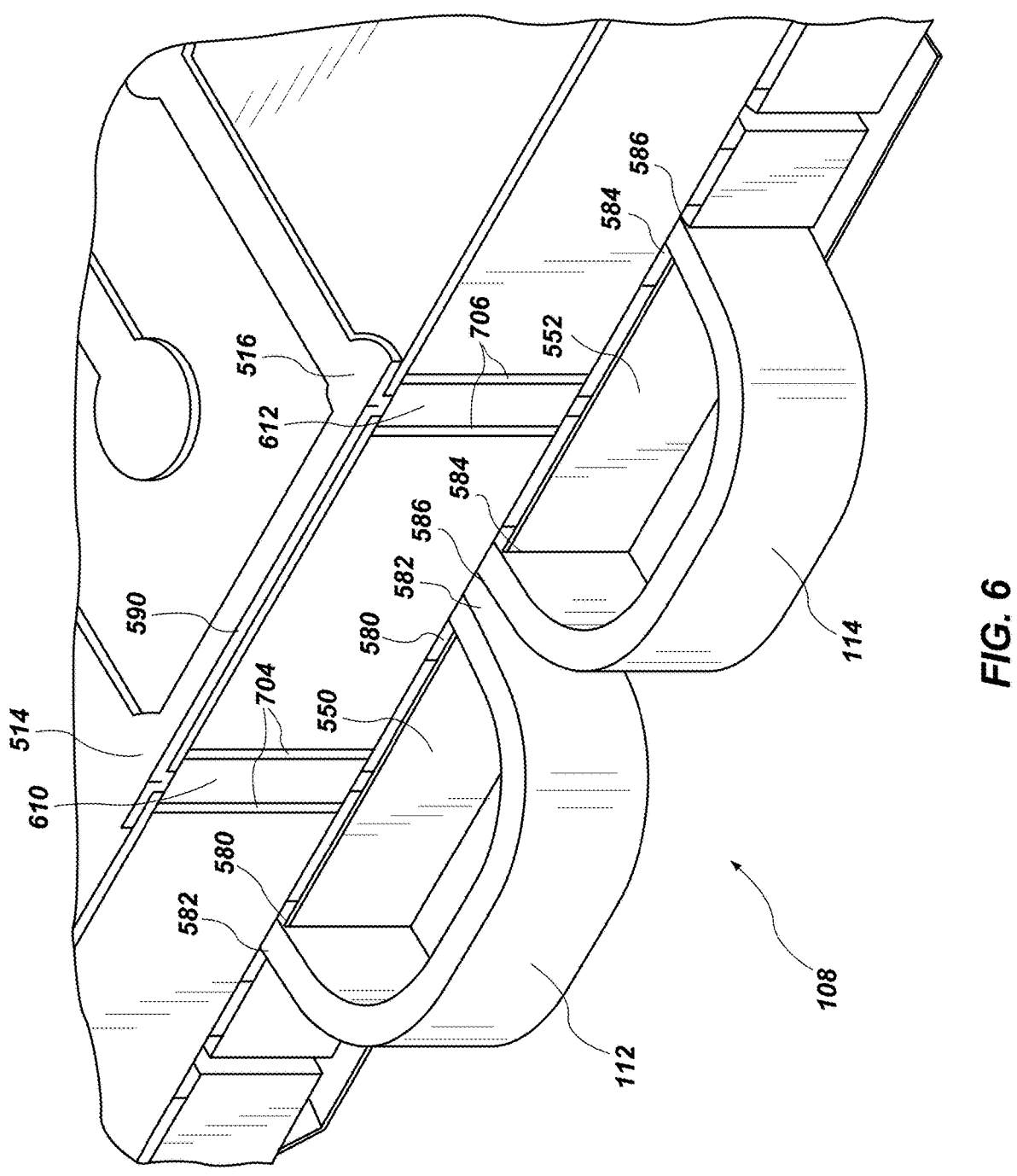
Figure 7:
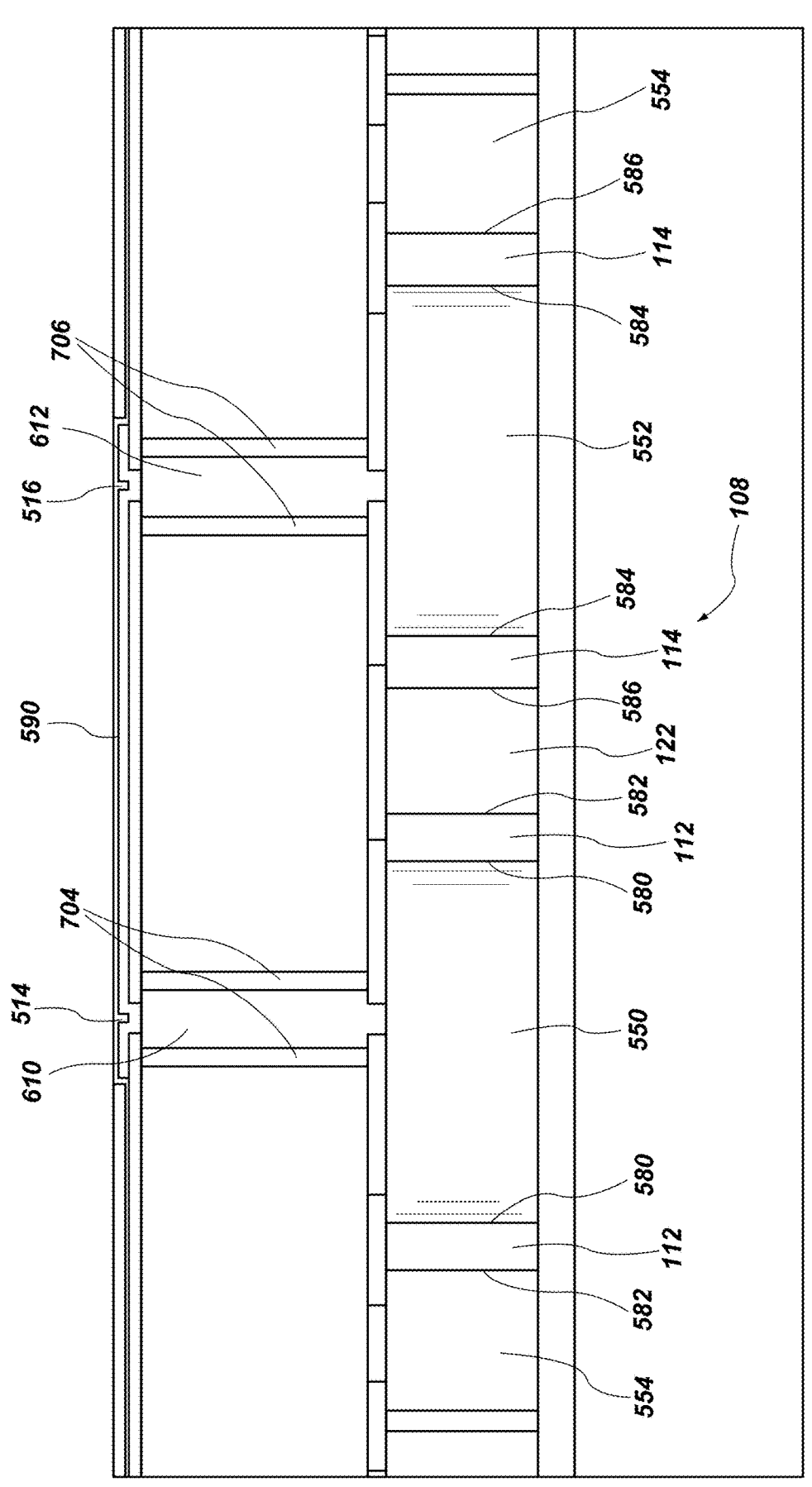
Figure 8:
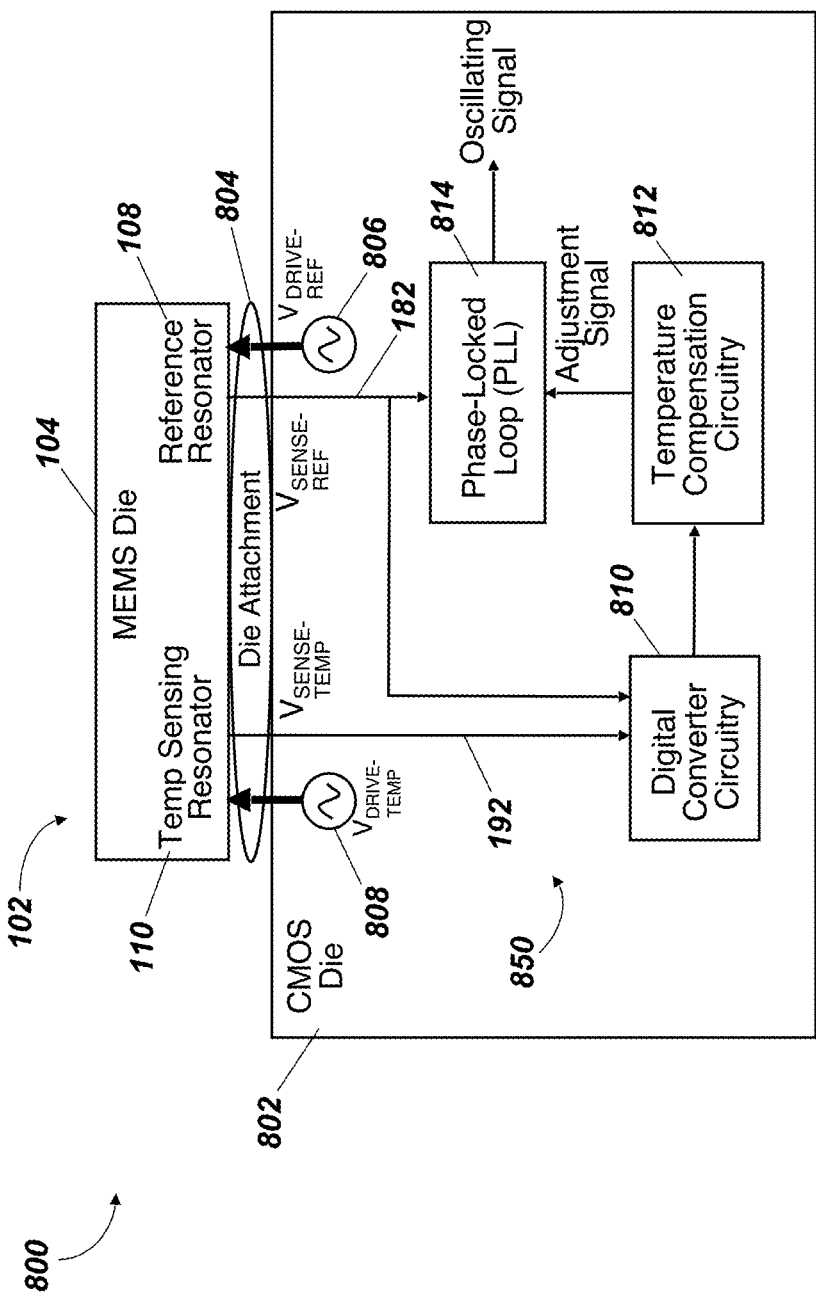
Figure 9:
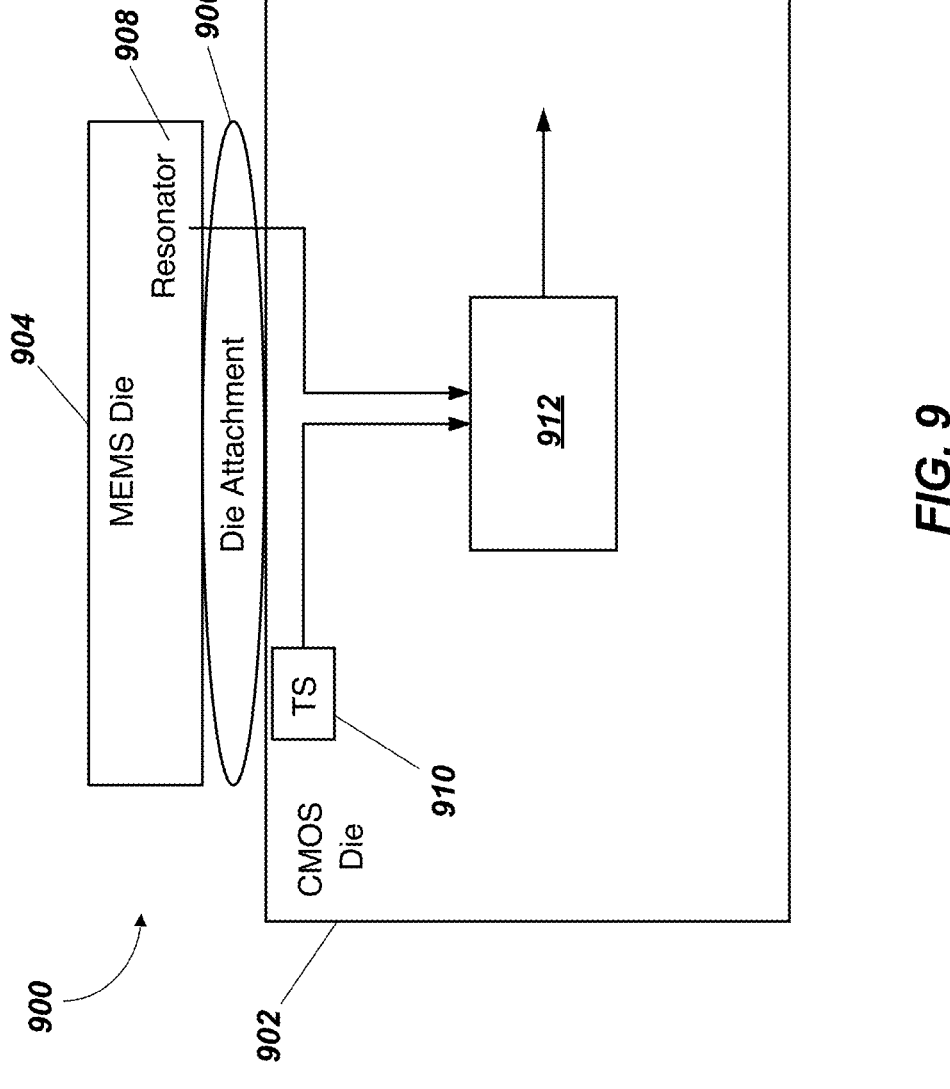
Figures 10A, 10B:
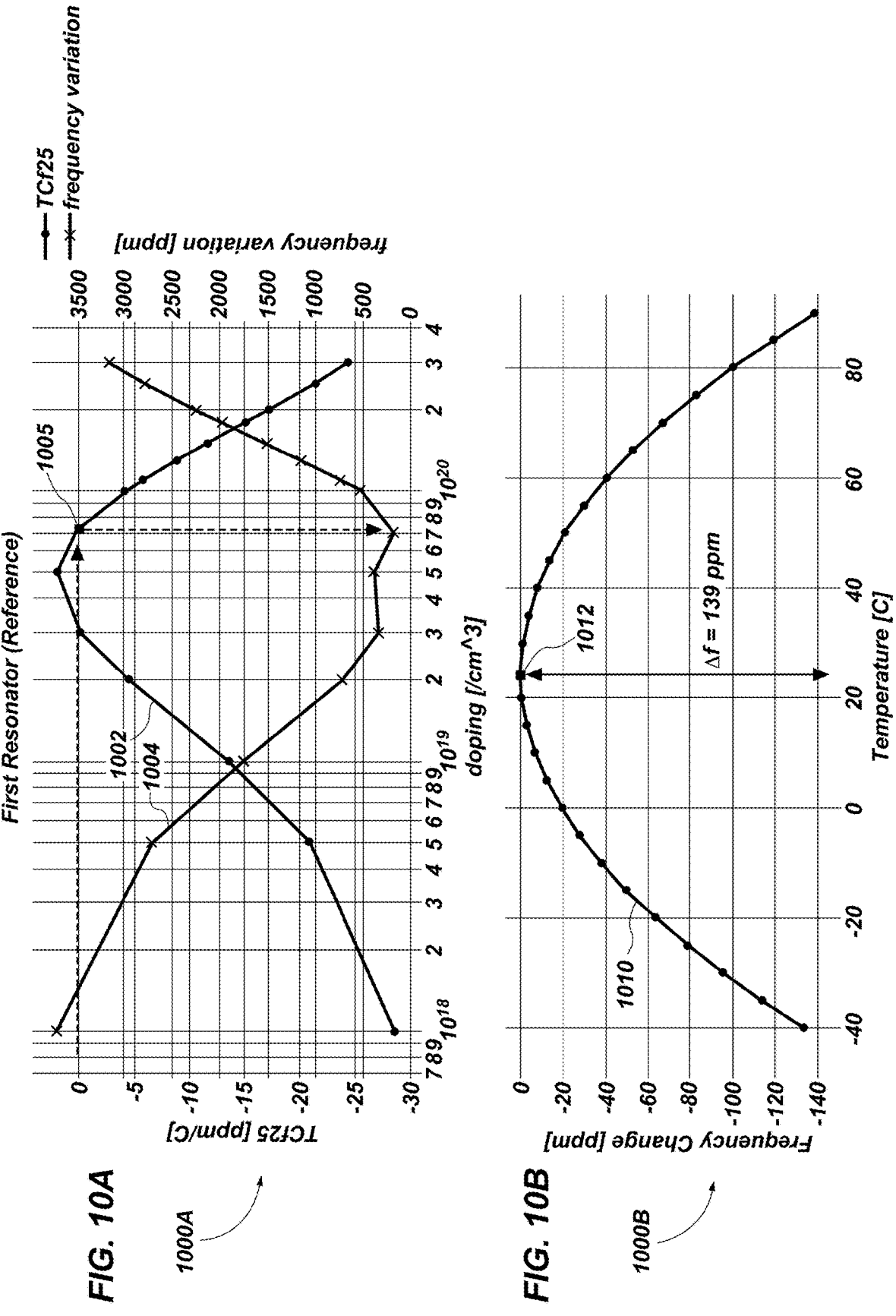
Figures 11A, 11B:
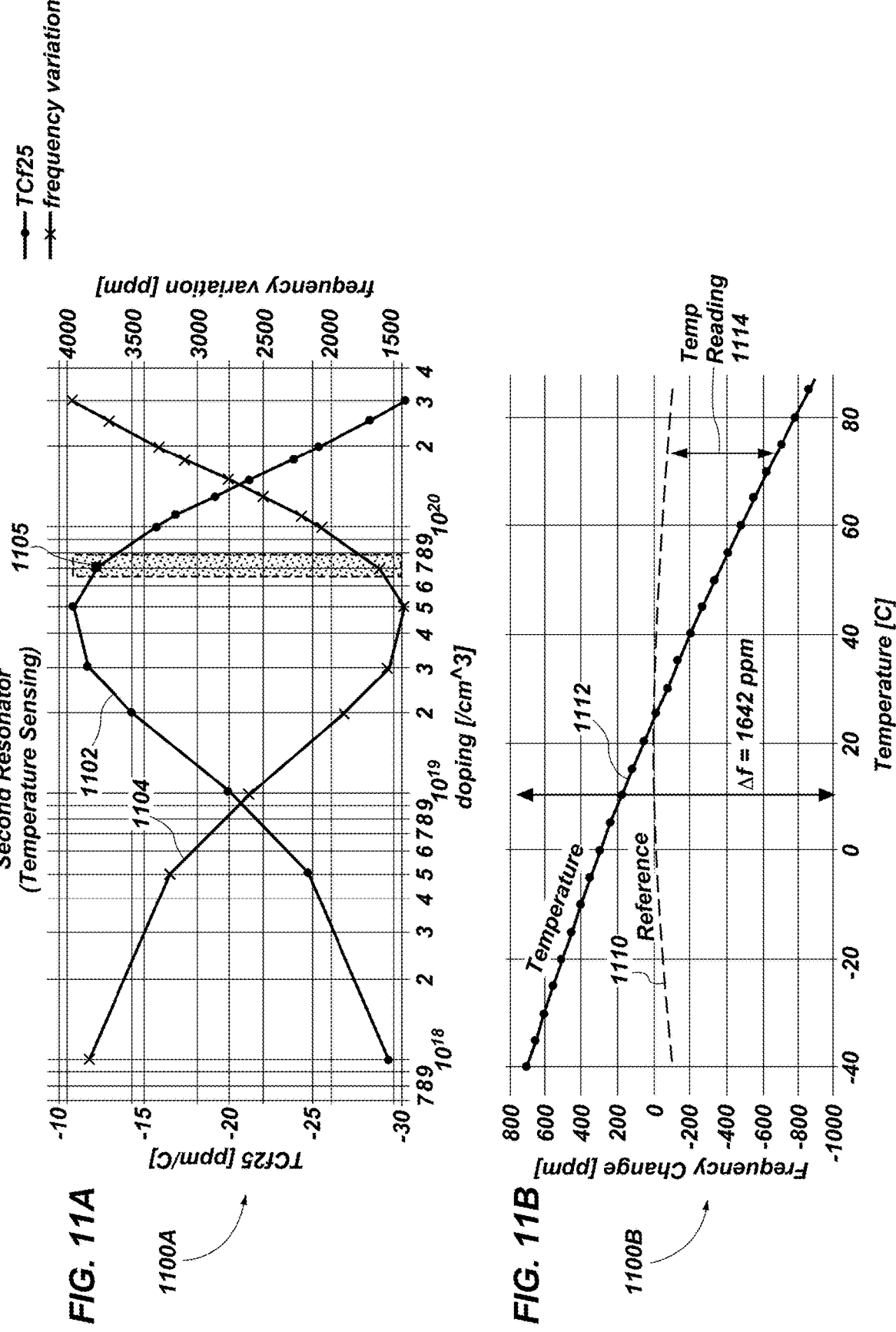
Figure 12:
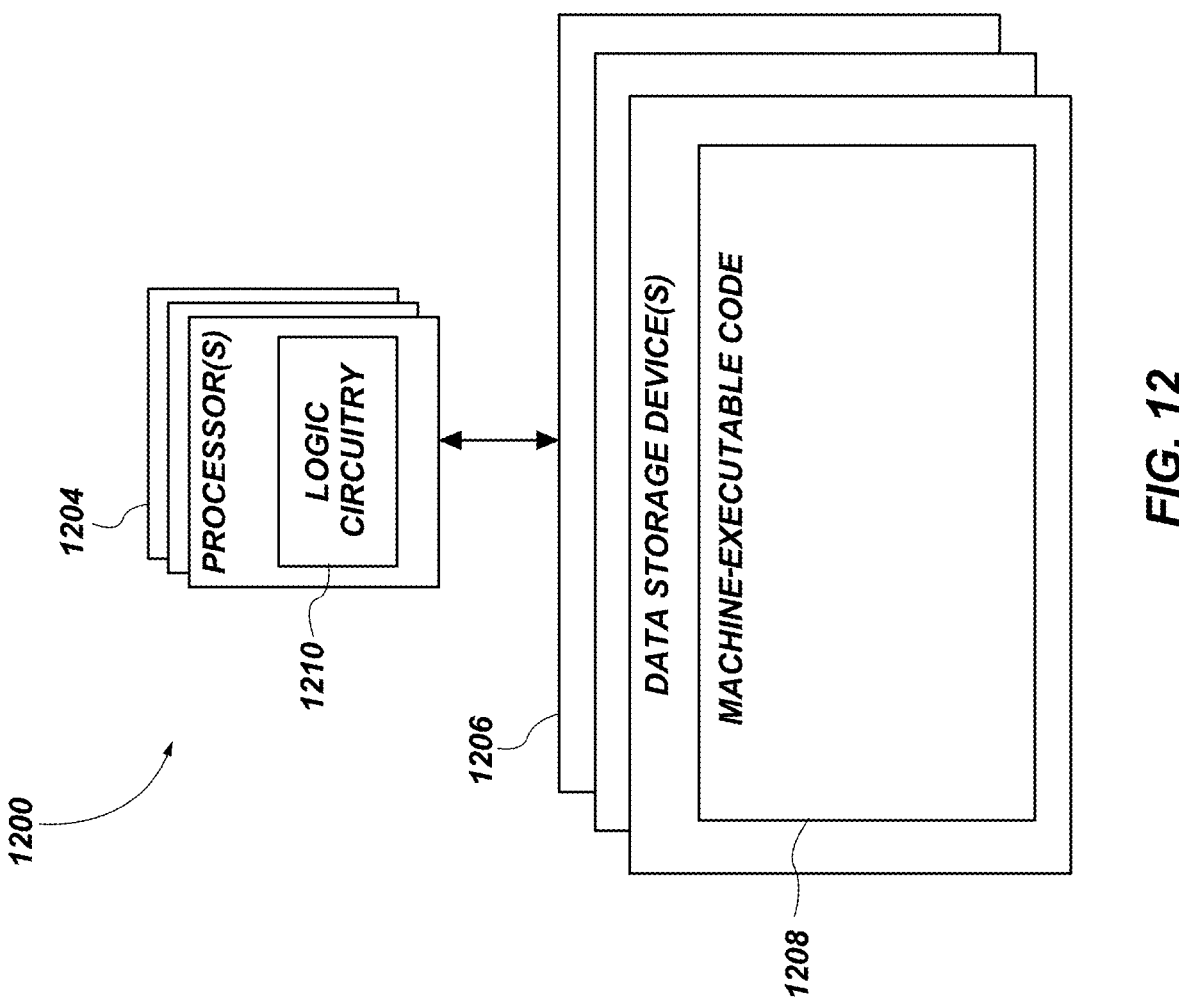

FIG. 4A is a top-down view of the apparatus of FIGS. 2 and 3, depicting a vibrating or resonating state of the first resonator that results in a first acoustic wave propagation in a first direction, according to one or more examples;

FIG. 4B is a top-down view of the apparatus of FIGS. 2 and 3, depicting a vibrating or resonating state of the second resonator that results in a second acoustic wave propagation in a second direction, according to one or more examples;

FIG. 5A is a top-down view of a schematic layout of the apparatus of FIGS. 2 and 3, according to one or more examples;

FIG. 5B is a close-up, top-down view of a portion of the schematic layout of the apparatus of FIG. 5A, indicating gaps that may separate resonating portions or rings of the first resonator from surrounding electrode material;

FIG. 6 is a perspective, partial cross-sectional view of a portion of the apparatus associated with the first resonator taken along a line A-A' of FIG. 5B;

FIG. 7 is a cross-sectional view of a portion of the apparatus associated with the first resonator also taken along a line A-A' of FIG. 5B;

FIG. 8 is a schematic block diagram of an apparatus comprising an oscillator including a dual resonator structure having a resonator and a second resonator, according to one or more examples;

FIG. 9 is a block diagram of an oscillator that is known to the inventor of this disclosure;

FIG. 10A is a graph of a first plot representing a relationship between a temperature coefficient of frequency (TCf) and a doping concentration for the first resonator (e.g., the reference resonator, without limitation), and a second plot representing a relationship between a frequency variation and the doping concentration for the first resonator, according to one or more examples;

FIG. 10B is a graph of a plot representing a relationship between a frequency change and a temperature for the first resonator;

FIG. 11A is a graph of a first plot representing a relationship between a TCf versus the doping concentration for the second resonator (e.g., temperature sensing resonator, without limitation), and a second plot representing a relationship between a frequency variation and the doping concentration for the second resonator, according to one or more examples;

FIG. 11B is a graph of a first plot of a frequency change versus temperature for the first resonator (e.g., reference resonator, without limitation) and a second plot of a frequency change versus temperature for the second resonator (e.g., temperature sensing resonator, without limitation); and FIG. 12 is a block diagram of a device that, in one or more examples, may be used to implement various functions, operations, acts, processes, or methods disclosed herein.

DETAILED DESCRIPTION

In the following detailed description, reference is made to the accompanying drawings, which form a part hereof, and in which are shown, by way of illustration, specific examples in which the present disclosure may be practiced. These examples are described in sufficient detail to enable a person of ordinary skill in the art to practice the present disclosure. However, other examples may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure.

The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example of this disclosure to the specified components, steps, functions, or the like.

It will be readily understood that the components of the examples as generally described herein and illustrated in the drawings could be arranged and designed in a wide variety of different configurations. Thus, the following description of various examples is not intended to limit the scope of the present disclosure but is merely representative of various examples. While the various aspects of the examples may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be depicted by block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art understand that information and signals may be represented using any of a variety of different technologies and techniques. For example, data, instructions, commands, information, signals, bits, and symbols that may be referenced throughout this description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal. A person having ordinary skill in the art would appreciate that this disclosure encompasses communication of quantum information and qubits used to represent quantum information.

The various illustrative logical blocks, modules, and circuits described in connection with the examples disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer executes computing instructions (e.g., software code, without limitation) related to examples of the present disclosure.

The examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, or a subprogram, without limitation. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

In this description, the term "coupled," and derivatives thereof, may be used to indicate that two elements cooperate or interact with each other. When an element is described as being "coupled" to another element, then the elements may be in direct physical or electrical contact or there may be intervening elements or layers present. In contrast, when an element is described as being "directly coupled" to another element, then there are no intervening elements or layers present. In this description, the term "connected" is used interchangeably with the term "coupled," and has the same meaning, unless expressly indicated otherwise or the context would indicate otherwise to a person having ordinary skill in the art.

In a microelectromechanical system (MEMS) based oscillator, a resonator may be used to generate an oscillator signal. Ideally, the resonator is to resonate or vibrate at a specific fixed frequency and sustain that frequency regardless of its surrounding environmental conditions. One of the most dominant environmental factors that affects the frequency of the resonator is temperature. In fact, most types of mechanical resonators resonate at a frequency that depends on temperature.

To generate a fairly accurate oscillator signal, a resonator may be used to produce a reference signal that is compensated for the frequency variation caused by changes in temperature. In traditional MEMS-based oscillators, the frequency variation of the reference signal may be compensated by a phase-locked loop (PLL) according to a temperature reading from a temperature sensor. With prior knowledge of the frequency versus temperature behavior of the MEMS resonator, the PLL may adjust the output frequency of the resonator according to the temperature reading.

In traditional MEMs-based oscillators, the MEMS resonator is on a MEMS die and the temperature sensor is on a CMOS die that is attached to the MEMS die. As a result, the temperature readings taken from the temperature sensor on the CMOS die may not necessarily accurately represent the temperature of the resonator on the MEMS die. Hence, there may be an offset between the temperature reading of the temperature sensor and the actual temperature of the resonator. Furthermore, a thermal gradient may exist between the temperature sensor on the CMOS die and the reference resonator on the MEMS die. If the resonator experiences a temperature change, it may take time for the temperature change to propagate to the CMOS-based temperature sensor. Depending on the boundary condition, a temperature bias may also exist. Such a time lag and temperature bias may adversely affect the PLL adjustment to result in an offset from the desired oscillation frequency.

In some traditional MEMs-based oscillators, the CMOS-based temperature sensor may be sensitive to other environment variables, such as the stress of the CMOS die. This sensitivity may cause incorrect temperature information to be communicated to the PLL. In addition, the CMOS-based temperature sensor may be an analog sensor (e.g., a relatively noise analog sensor) that requires use of an analog-to-digital converter (ADC). The ADC may have a limited number of ADC bits, which may undesirably limit the resolution of the temperature sensor and resulting accuracy of the compensation.

According to one or more examples of the disclosure, a microelectromechanical system includes a semiconductor body comprising a first resonator (e.g., a reference resonator, without limitation), a second resonator (e.g., a temperature-sensing resonator, without limitation), and a supporting portion to support both the first resonator and the second resonator (herein referred to as a "dual resonator structure"). In one or more examples, the first resonator is to resonate at a first resonating frequency that is relatively (as compared to the second resonator) frequency-stable (or temperature insensitive) over a predetermined temperature range (e.g., an operating temperature range, without limitation). The second resonator is to resonate at a second resonating frequency that is relatively (as compared to the first resonator) temperature-dependent (or temperature sensitive) over the predetermined temperature range. In one or more examples, the second resonator is to resonate at a second resonating frequency that decreases (e.g., generally linearly) as temperature increases over the predetermined temperature range. In one or more other examples, the second resonator is to resonate at a second resonating frequency that increases (e.g., generally linearly) as temperature increases over the predetermined temperature range.

In one or more examples, the temperature of the dual resonator structure may be extracted from the first and the second resonators at least partially based on the difference in frequency changes of the first and the second resonating frequencies. As the temperature changes, the difference in the frequency changes of the first and the second resonating frequencies varies proportionally. By directly measuring the difference in the changes of the two frequencies, the temperature of the dual resonator structure may be extracted. A corresponding adjustment signal may be used to adjust the first resonating frequency (e.g., the reference frequency, without limitation) from the first resonator (e.g., the reference resonator, without limitation). The adjustment of the first resonating frequency may improve the accuracy of the first resonating frequency over the predetermined temperature range.

In one or more examples, the first and the second resonators share the same single supporting portion (e.g., as a single body, without limitation) on the same MEMS die. Thus, in one or more examples, the temperatures of the first and the second resonators may be (e.g., almost or substantially, without limitation) identical as a result of sharing the supporting portion. In one or more examples, the dual resonator structure including the first and the second resonators is on the same single MEMS die to provide an improved thermal coupling between the first and the second resonators. In one or more specific examples, the dual resonator structure may be provided in a compact configuration on a single die having a relatively small die size. Thus, in one or more examples, the temperature offset and the thermal gradient between the first and the second resonators may be substantially reduced. In one or more examples, there may be zero (e.g., a zero, an almost zero, or negligible, without limitation) temperature offset and/or zero (e.g., a zero, an almost zero, or negligible, without limitation) thermal gradient between the first and the second resonators. Accordingly, in one or more examples, the temperature extracted from the dual resonator structure may be more accurate.

In one or more examples, the respective shapes and sizes of the first and the second resonators are (e.g., almost or substantially, without limitation) identical. In addition, the first and the second resonators are anchored at a center of the supporting portion in a symmetrical configuration. Thus, in one or more examples, the first and the second resonators of the dual resonator structure are substantially symmetric to each other. In one or more examples, as a result of the substantial symmetry between the first and the second resonators, there is zero (e.g., a zero, an almost zero, or negligible, without limitation) temperature bias and/or zero (e.g., a zero, an almost zero, or negligible, without limitation) thermal gradient between the first and the second resonators. In one or more examples, the symmetrical configuration helps to reduce or eliminate any thermal mismatch as a result of different thermal paths that would otherwise exist.

In one or more examples, the first and the second resonators of the dual resonator structure are configured to be virtually floating (e.g., within a packaging, without limitation) using a single supporting anchor in the supporting portion. In one or more examples, little or no mechanical stress difference exists between the first and the second resonators as a result of use of the single supporting anchor in the supporting portion. The heat path to the anchor through the shared support structure helps facilitate zero (e.g., a zero, an almost zero, or negligible, without limitation) temperature bias and thermal gradient between the first and the second resonators.

In one or more examples, the semiconductor body is made of a highly doped, single crystal silicon. In one or more examples, the first and the second resonators of the dual resonator structure have different frequency versus temperature profiles by engineering the directions of the acoustic wave vibration propagations and the doping levels of the single crystal silicon. The semiconductor body made of the single crystal silicon may derive its mechanical vibration characteristics from this crystal orientation. In one or more examples, the different temperature sensitivities in the first and the second resonators may be achieved by orienting the first and the second resonators at a (non-zero) orientation angle. The orientation angle between the first and the second resonators causes the acoustic wave propagation directions of the first and the second resonators to be non-parallel. This is possible in single crystal silicon material due to the asymmetric silicon cubic crystal structure.

Thus, even when using (substantially) identical shapes and sizes of the first and the second resonators, the vibration frequencies of the first and the second resonators change differently with respect to temperature depending on the directions of the acoustic wave vibration propagations. In one or more examples, the first and the second resonators may be provided with a differential orientation angle (e.g., about 45°) that results in a relatively large difference in respective frequency versus temperature profiles. In one or more examples, other differential orientation angles between the first and second resonators are utilized.

Figure 1:
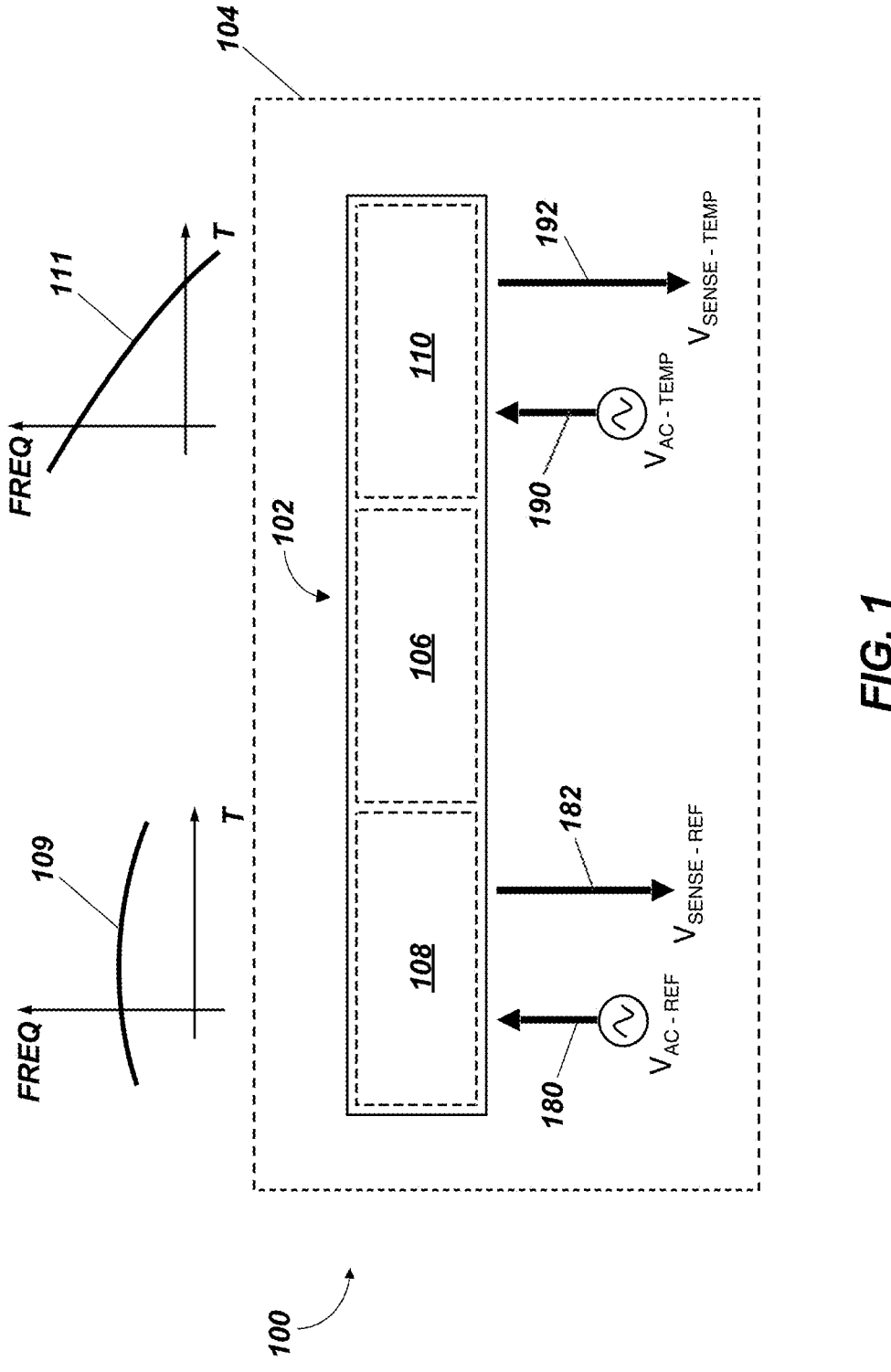
FIG. 1 is a block diagram of an apparatus including a microelectromechanical system (MEMS) comprising a semiconductor body on a MEMS die, where the semiconductor body comprises a first resonator, a second resonator, and a supporting portion to support both the first resonator and the second resonator ("dual resonator structure"), according to one or more examples.

FIG. 1 is a block diagram of an apparatus 100 including a MEMS comprising a semiconductor body 102 on a MEMS die 104. Semiconductor body 102 comprises a first resonator 108 (e.g., a reference resonator, without limitation), a second resonator 110 (e.g., a temperature sensing resonator, without limitation), and a supporting portion 106 to support both first resonator 108 and second resonator 110. Semiconductor body 102 including first resonator 108, second resonator 110, and supporting portion 106 may be referred to herein as a "dual resonator structure" according to one or more examples.

As shown in FIG. 1, first resonator 108 and second resonator 110 of semiconductor body 102 share the same supporting portion 106 of semiconductor body 102. In one or more examples, first resonator 108 and second resonator 110 are mechanically and/or thermally coupled or connected to each other via supporting portion 106. In one or more examples, first resonator 108 and second resonator 110 are located on opposite sides of semiconductor body 102. As a non-limiting example as shown in FIG. 1, first resonator 108 is located on a first end of semiconductor body 102 and second resonator 110 is located on a second end of semiconductor body 102, which is opposite the first end. In one or more other examples, respective ones of first resonator 108 and second resonator 110 may be located at or along any portion of semiconductor body 102.

A first drive signal 180 (e.g., $V_{AC\text{-}REF}$) is generated to drive at least one drive electrode of first resonator 108 to cause first resonator 108 to resonate or vibrate at a first resonating frequency. In response to first drive signal 180, a first sense signal 182 (e.g., $V_{SENSE\text{-}REF}$) (e.g., a reference signal) having the first resonating frequency is sensed from at least one sense electrode of first resonator 108. Similarly, a second drive signal 190 (e.g., $V_{AC\text{-}TEMP}$) is generated to drive at least one drive electrode of second resonator 110 to cause second resonator 110 to resonate or vibrate at a second resonating frequency. In response to second drive signal 190, a second sense signal 192 (e.g., $V_{SENSE\text{-}TEMP}$) (e.g., a temperature signal) having the second resonating frequency is sensed from at least one sense electrode of second resonator 110.

In one or more examples, first resonator 108 is configured as a reference resonator, and second resonator 110 is configured as a temperature sensing resonator. In one or more examples, first resonator 108 is to resonate at a first resonating frequency that is generally frequency-stable over a predetermined temperature range. A frequency versus temperature profile 109 of first resonator 108 of FIG. 1 illustrates one example of a generally frequency-stable frequency associated with first resonator 108. In one or more examples, second resonator 110 is to resonate at a second resonating frequency that generally decreases as temperature increases over the predetermined temperature range. A frequency versus temperature profile 111 of second resonator 110 of FIG. 1 illustrates one example of a generally temperature-dependent frequency associated with second resonator 110. In one or more other examples, second resonator 110 is to resonate at a second resonating frequency that generally increases as temperature increases over the predetermined temperature range. In one or more examples, first resonator 108 has a first temperature coefficient of frequency and second resonator 110 has a second temperature coefficient of frequency. The second temperature coefficient of frequency of second resonator 110 is different from the first temperature coefficient of frequency of first resonator 108.

In one or more examples, first resonator 108 and second resonator 110 may be used together to produce a temperature-compensated oscillator signal. An adjustment signal may be generated or computed at least partially based on first and second sense signals 182 and 192. The adjustment signal may be used to adjust or compensate the frequency of the reference signal (e.g., the frequency of first sense signal 182 associated with first resonator 108). In one or more examples, an adjustment signal may be generated or computed at least partially based on a ratio of frequency changes in the respective frequencies of first and second sense signals 182 and 192.

In one or more examples, sensing and/or adjustment may be performed with use of one or more temperature-to-digital converters (TDCs). Here, in one or more examples, an adjustment signal may be generated or computed at least partially based on a ratio of changes in respective temperatures associated with first and second sense signals 182 and 192 (e.g., using a TDC). In one or more examples, the frequency of first sense signal 182 may be adjusted at least partially based on the adjustment signal (e.g., temperature change) to produce the temperature-compensated oscillator signal.

FIG. 2 is a perspective view of apparatus 100 of FIG. 1, according to one or more examples. In FIG. 2, respective ones of first resonator 108 and second resonator 110 of semiconductor body 102 are dual-ring resonators. In the dual-ring configuration of FIG. 2, first resonator 108 comprises a first ring 112, a second ring 114, and a coupling beam 116 that couples first and second rings 112 and 114. Similarly, second resonator 110 comprises a first ring 118, a second ring 120, and a coupling beam 122 that couples first and second rings 118 and 120. Respective ones of first ring 112 and second ring 114 of first resonator 108 may be referred to as resonating portions of first resonator 108, and respective ones of first ring 118 and second ring 120 of second resonator 110 may be referred to as resonating portions of second resonator 110.

In one or more examples, supporting portion 106 mechanically and/or thermally couples or connects first resonator 108 and second resonator 110. In one or more examples, supporting portion 106 has a generally rectangular body (e.g., which may be rotated, angled, curved, or bent according to one or more examples, without limitation). In one or more alternative examples, supporting portion 106 may have the shape of an oval, an ellipse, a crescent, a triangle, a square, a pentagon, a hexagon, a heptagon, an octagon, a nonagon, a decagon, a trapezoid, a parallelogram, a rhombus, or a kite.

As shown, a connecting portion of supporting portion 106 may protrude from semiconductor body 102 to connect to coupling beam 116 of first resonator 108. The connecting portion may (e.g., closely) surround or encircle a respective (e.g., small) portion of a perimeter (e.g., outer circumference, without limitation) of first ring 112 and second ring 114. In one or more examples, the connecting portion may (e.g., closely) surround or encircle about 25% or less of a respective perimeter (e.g., outer circumference, without limitation) of first ring 112 and second ring 114. In other one or more examples, the connecting portion may (e.g., closely) surround or encircle more or less than 25% of a respective perimeter (e.g., outer circumference, without limitation) of first ring 112 and second ring 114.

Also as shown, a connecting portion of supporting portion 106 may protrude from semiconductor body 102 to connect to coupling beam 122 of second resonator 110. The connecting portion may (e.g., closely) surround or encircle a respective (e.g., small) portion of a perimeter (e.g., outer circumference, without limitation) of first ring 118 and second ring 120. In one or more examples, the connecting portion may (e.g., closely) surround or encircle about 25% or less of a respective perimeter (e.g., outer circumference, without limitation) of first ring 118 and second ring 120. In other one or more examples, the connecting portion may (e.g., closely) surround or encircle more or less than 25% of a respective perimeter (e.g., outer circumference, without limitation) of first ring 118 and second ring 120.

In one or more examples, a respective one of first resonator 108 and second resonator 110 is of a different resonator type or configuration than a dual-ring resonator. In one or more alternative examples, a respective one of first resonator 108 and second resonator 110 may be a single ring resonator, a disc resonator, a square plate resonator, a clamped-clamped resonator, a cantilever resonator, a fixed-fixed beam resonator, or a comb drive resonator.

In one or more examples, semiconductor body 102 may comprise a heavily doped, single crystal silicon. In one or more examples, materials for semiconductor body 102 may be or include one or more of polycrystalline silicon, monocrystalline silicon, germanium, diamond, tin, carbon, sulfur, selenium, tellurium, or any alloy thereof. Additional or alternative materials for semiconductor body 102 may be or include boron nitride (BN), boron (B), phosphide (P), boron arsenide (BAs), aluminum nitride (AlN), aluminum phosphide (AlP), aluminum arsenide (AlAs), aluminum antimonide (AlSb), gallium nitride (GaN), gallium phosphide (GaP), gallium arsenide (GaAs), gallium antimonide (GaSb), indium nitride (InN), indium phosphide (InP), indium arsenide (InAs), indium antimonide (InSb), cadmium selenide (CdSe), cadmium sulfide (CdS), cadmium telluride (CdTe), oxides of any kind (e.g., $Al_2O_3$, ZnO, CuO, PbO, without limitation), zinc selenide (ZnSe), zinc sulfide (ZnS), zinc telluride (ZnTe), cuprous chloride (CuCl), copper sulfide (CuS), lead selenide (PbSe), lead sulfide (PbS), lead telluride (PbTe), tin sulfide (SnS), tin telluride (SnTe), lead tin telluride (PbSnTe), bismuth telluride ($Bi_2Te_3$), cadmium phosphide ($CdP_2$), cadmium arsenide ($CdAs_2$), zinc phosphide ($Zn_3P_2$), zinc diphosphide ($ZnP_2$), zinc arsenide ($Zn_3As_2$), zinc antimonide ($Zn_3Sb_2$), titanium (Ti), copper (Cu), uranium (U), barium titanate ($BaTiO_3$), strontium titanate ($SrTiO_3$), lithium niobate ($LiNbO_3$), vanadium (V), molybdenum disulfide ($MoS_2$), gallium selenide (GaSe), indium selenide (InSe), iron (Fe), or any alloy thereof.

Shapes, sizes, and orientations of first resonator 108 and second resonator 110 are described with reference to FIG. 3. Respective ones of the one or more resonating portions of first resonator 108 (e.g. first ring 112 and second ring 114, without limitation) have a first shape and a first size. Respective ones of the one or more resonating portions of second resonator 110 (e.g. first ring 118 and second ring 120, without limitation) have a second shape and a second size. In one or more examples, the second shapes of the respective ones of the one or more resonating portions of second resonator 110 are substantially the same as the first shapes of the respective ones of the one or more resonating portions of first resonator 108. In the illustrated example of FIG. 3, the respective ones of the one or more resonating portions of first resonator 108 and second resonator 110 have shapes that are circles or rings (e.g., or rounded square, squircle, superellipse-based squircle, etc.). In one or more examples, the second sizes of the respective ones of the one or more resonating portions of second resonator 110 are substantially the same as the first sizes of the respective ones of the one or more resonating portions of first resonator 108.

In one or more alternative examples, respective ones of first ring 112 and second ring 114 and/or respective ones of first ring 118 and second ring 120 are configured with different shapes and/or different sizes. As some examples, a cross-sectional shape of a respective one of the rings may be a square, a triangle, a rectangle, a rhombus, an octagon, a pentagon, a hexagon, and so on, or some oblong, oblique, orbicular variation, and so on.

In one or more examples, first resonator 108 and second resonator 110 are substantially symmetric about a lateral axis 380 of semiconductor body 102. In one or more examples, symmetry may be observed by comparing the semiconductor body portion that includes first resonator 108 (e.g., from the left/top side of a lateral axis 362 of semiconductor body 102) with the semiconductor body portion that includes second resonator 110 (e.g., from the right side of a lateral axis 360 of semiconductor body 102). In one or more alternative examples, first resonator 108 and second resonator 110 are non-symmetrical about the lateral axis (i.e., lateral axis 360 or lateral axis 362, without limitation) of semiconductor body 102.

In one or more examples, first and second resonators 108 and 110 are virtually floating within a packaging/cap and anchored, at an anchor point 150, at the center of supporting portion 106 in a symmetrical configuration. In one or more examples, anchor point 150 or the center of supporting portion 106 is considered to be a rotation point (e.g., the cartesian origin, without limitation) at which supporting portion 106 may be angled, bent, or curved.

In one or more examples, a differential orientation angle (e.g., an angle A) between first resonator 108 and second resonator 110 is defined relative to lateral axis 360 and lateral axis 362. More particularly, an orientation of first resonator 108 may be defined relative to a longitudinal axis 350 and/or a longitudinal axis 352 of semiconductor body 102 (and/or of supporting portion 106). Similarly, an orientation of second resonator 110 may be defined relative to longitudinal axis 350 and/or longitudinal axis 352. In one or more examples, first resonator 108 is orientated at a first orientation angle with respect to longitudinal axis 350, and second resonator 110 is oriented at a second orientation angle with respect to longitudinal axis 350. In one or more examples, the second orientation angle is different from the first orientation angle. As shown, longitudinal axis 352 may be defined as passing in between rings 112 and 114 of first resonator 108. The same orientation, as it relates to rings 118 and 120 of second resonator 110, is noted for longitudinal axis 350.

In a specific, non-limiting example, relative to longitudinal axis 352, the first orientation angle of first resonator 108 is about 0° and the second orientation angle of second resonator 110 is about 45°; therefore, the differential orientation angle between first resonator 108 and second resonator 110 is about 45°. Relative to longitudinal axis 350, the first orientation angle of first resonator 108 is about 0° and the second orientation angle of second resonator 110 is about 45°; again, the differential orientation angle between first resonator 108 and second resonator 110 is about 45°. In one or more examples, first resonator 108 and second resonator 110 are orientated at different angles than those shown and described. In one or more examples, the differential orientation angle between first resonator 108 and second resonator 110 may be configured to be within a range of about 100-80°.

As described, supporting portion 106 comprises a body having at least one bend at an angle to provide a differential orientation angle between the first dual-ring resonator and the second-dual ring resonator. In one or more specific examples, first resonator 108 and second resonator 110 are of the same resonator type (e.g., dual-ring resonators, without limitation), have substantially the same shapes and sizes (e.g., circles or rings, without limitation), and are substantially symmetric about a lateral axis of semiconductor body 102, but are oriented at different orientation angles relative to a longitudinal axis of semiconductor body 102 (i.e., a non-zero, differential orientation angle exists between first resonator 108 and second resonator 110).

Accordingly, in one or more examples, first and second resonators 108 and 110 have different frequency versus temperature profiles by engineering the directions of the acoustic wave vibration propagations and the doping levels of the single crystal silicon. Semiconductor body 102 made of the single crystal silicon may derive its mechanical vibration characteristics from this crystal orientation. In one or more examples, the different temperature sensitivities in first and second resonators 108 and 110 may be achieved by orienting first and second resonators 108 and 110 at a (non-zero) orientation angle. The orientation angle between first and second resonators 108 and 110 causes the acoustic wave propagation directions of first and second resonators 108 and 110 to be non-parallel. This is possible in single crystal silicon material due to the asymmetric silicon cubic crystal structure.

FIG. 4A is a top-down view of apparatus 100 of FIGS. 2 and 3, depicting a vibrating or resonating state of first resonator 108 that results in a first acoustic wave propagation in a first direction, according to one or more examples. In the vibrating or resonating state, first resonator 108 is repeatedly alternating between a contraction deformation shape and an expansion deformation shape. First resonator 108 undergoes compressive stresses during contraction and tensile stresses during expansion. In the illustrative example of FIG. 4A, first ring 112 of first resonator 108 is shown in a contraction deformation shape 406a associated with directions 402a and in an expansion deformation shape 406b (shown in an outside insert) associated with directions 402b, without limitation. In FIG. 4A, respective ones of first and second rings 118 and 120 of second resonator 110 are shown in a non-vibrating or non-resonating state.

FIG. 4B is a top-down view of apparatus 100 of FIGS. 2 and 3, depicting a vibrating or resonating state of second resonator 110 that results in a second acoustic wave propagation in a second direction, according to one or more examples. In the vibrating or resonating state, second resonator 110 is repeatedly alternating between a contraction deformation shape and an expansion deformation shape. Like first resonator 108, second resonator 110 undergoes compressive stresses during contraction and tensile stresses during expansion. In the illustrative example of FIG. 4B, first ring 118 of second resonator 110 is shown in a contraction deformation shape 408a associated with directions 404a and in an expansion deformation shape 408b (shown in an outside insert) associated with directions 404b, without limitation. In FIG. 4B, respective ones of first and second rings 112 and 114 of first resonator 108 are shown in a non-vibrating or non-resonating state.

Again, respective ones of first and second resonators 108 and 110 undergo compressive stresses during contraction (e.g., contraction deformation shapes 406a and 408a) and tensile stresses during expansion (e.g., expansion deformation shapes 406b and 408b). In one or more specific examples (e.g., FIGS. 4A-4B), in response to respective drive signals, respective quarter sections of the rings of first resonator 108 and second resonator 110 contract and expand. In one or more examples, first and second resonators 108 and 110 undergo these stresses (i.e., compressive and tensile stresses) at the same time, at different times, or at alternating times (e.g., when one of first or second resonators 108 or 110 undergoes compressive stresses, the other undergoes tensile stresses). In one or more examples, respective half sections of the rings contract and expand in unison. In a specific, non-limiting example, rings 112 and 114 of first resonator 108 may contract and expand substantially in unison, and rings 118 and 120 of second resonator 110 may contract and expand substantially in unison.

Given the differential orientation angle between first resonator 108 and second resonator 110, the first direction(s) of the first acoustic wave propagation and the second direction(s) of the second acoustic wave propagation are non-parallel. In one or more examples, the first direction(s) of first acoustic wave propagation is rotated by the angle A (FIG. 3) relative to the second direction(s) of second acoustic wave propagation.

In one or more examples, first and second resonators 108 and 110 of the dual resonator structure are configured with different frequency versus temperature profiles by engineering the directions of the acoustic wave vibration propagations (FIGS. 3, 4A, and 4B) and doping levels of the single crystal silicon (described later in relation to FIGS. 10A-10B and 11A-11B).

FIG. 5A is a top-down view of a schematic layout of apparatus 100 of FIGS. 2 and 3, according to one or more examples. The schematic layout in FIG. 5A is substantially the same as the view shown in FIG. 3 with the inclusion of electrode portions, conductive lines, and conducting pads for driving and sensing first and second resonators 108 and 110.

Supporting portion 106 of semiconductor body 102 includes a bias electrode 504 coupled to a conductive line 505, through a conductive via 506, to extend for connection to a conductive pad 502. Conductive pad 502 is to provide a bias signal ($V_{Bias}$) for biasing supporting portion 106. In one or more examples, conductive via 504 is provided at the anchor point at the center of supporting portion 106 for anchoring semiconductor body 102.

With respect to first resonator 108 (e.g., the reference resonator, without limitation), semiconductor body 102 includes a drive electrode 550 within first ring 112 and a drive electrode 552 within second ring 114. A conductive pad 512 for a drive signal ($V_{d, ref}$) is coupled to a conductive line 558, which is further coupled to conductive vias 514 and 516, via a conductive bridge 590, for driving drive electrodes 550 and 552, respectively. A sense electrode 554, which (e.g., closely) surrounds the outer portions of first ring 112 and second ring 114, is coupled to a conductive line 556 through a conductive via 524 to extend to a conductive pad 522 for receiving a sense signal ($V_{s, ref}$).

With respect to second resonator 110 (e.g., the temperature sensing resonator, without limitation), semiconductor body 102 includes a drive electrode 560 within first ring 118 and a drive electrode 562 within second ring 120. A conductive pad 532 for a drive signal ($V_{d, temp}$) is coupled to a conductive line 568, which is further coupled to conductive vias 534 and 536, via a conductive bridge 592, for driving drive electrodes 560 and 562, respectively. A sense electrode 564, which (e.g., closely) surrounds the outer portions of first ring 118 and second ring 120, is coupled to a conductive line 566 through a conductive via 544 to extend to a conductive pad 542 for receiving a sense signal ($V_{s, temp}$).

Note that drive signal ($V_{d, ref}$) and sense signal ($V_{s, ref}$) of first resonator 108 of FIG. 5A corresponds to first drive signal 180 ($V_{AC-REF}$) and first sense signal 182 ($V_{SENSE-REF}$), respectively, of FIGS. 1 and 2, and drive signal ($V_{d, temp}$) and sense signal ($V_{s, temp}$) of second resonator 110 of FIG. 5A corresponds to second drive signal 190 ($V_{AC-TEMP}$) and second sense signal 192 ($V_{SENSE-TEMP}$), respectively, of FIGS. 1 and 2.

FIG. 5B is a close-up, top-down view of a portion of the schematic layout of apparatus 100 of FIG. 5A. The close-up, top-down view is provided to indicate gaps (e.g., air gaps) that may separate the resonating portions or rings of the resonators from surrounding electrode material. More particularly, a gap 580 is provided between an inner perimeter or circumference of first ring 112 and drive electrode 550, and a gap 582 is provided between an outer perimeter or circumference of first ring 112 and sense electrode 554 (as well as a portion of supporting portion 106). In addition, a gap 584 is provided between an inner perimeter or circumference of second ring 114 and drive electrode 552, and a gap 586 is provided between an outer perimeter or circumference of second ring 114 and sense electrode 554 (as well as a portion of supporting portion 106). Gaps that separate first and second rings 118 and 120 (FIG. 5A) of second resonator 110 from its surrounding electrode material may be provided as well in the same or similar manner.

FIG. 6 is a perspective, partial cross-sectional view of a portion of the apparatus associated with first resonator 108 taken along a line A-A' of FIG. 5B. In this particular example view, the apparatus is covered above and within respective half side portions of rings 112 and 114 of first resonator 108 as shown in partial cross-section, and uncovered and without cross-section for respective other half side portions of rings 112 and 114 of first resonator 108 (e.g., drive/sense electrode materials removed). FIG. 7 is a cross-sectional view of a portion of the apparatus associated with first resonator 108 also taken along a line A-A' of FIG. 5B.

In FIGS. 6 and 7, respective ones of conductive vias 514 and 516 are coupled to drive electrodes 550 and 552, respectively, through conductive material portions 610 and 612, respectively. Conductive material portion 610 associated with conductive via 514 is separated from surrounding materials by surrounding insulating portion 704, and conductive material portion 612 associated with conductive via 516 is separated from surrounding materials by surrounding insulating portion 706. Gaps 580 and 582 between first ring 112 and surrounding electrode materials, and gaps 584 and 586 between second ring 114 and surrounding electrode materials, are also indicated in FIGS. 6 and 7. Note that the second resonator including its associated rings may be configured in the same or similar fashion as first resonator 108 including rings 112 and 114.

FIG. 8 is a schematic block diagram of an apparatus 800 comprising an oscillator including the dual resonator structure having first resonator 108 and second resonator 110, according to one or more examples. In one or more examples, the oscillator of FIG. 8 is a temperature-compensated oscillator to generate an oscillating signal having a frequency that is substantially stable (e.g., temperature insensitive, without limitation) over a predetermined temperature range. Apparatus 800 comprising the oscillator having the dual resonator structure may be a substitute for (e.g., may be utilized instead of, without limitation) existing quartz-based oscillators, such as crystal oscillators (XOs) or temperature-compensated crystal oscillators (TCXOs).

Apparatus 800 includes MEMS die 104 attached to a complementary metal-oxide semiconductor (CMOS) die 802 via a die attachment 804 (e.g., an epoxy or other, without limitation). As described earlier in relation to FIG. 1, MEMS die 104 includes the dual resonator structure having first resonator 108 (e.g., the reference resonator, without limitation) and second resonator 110 (e.g., the temperature sensing resonator, without limitation). CMOS die 802 includes an electronic circuitry 850 to produce an oscillating signal using first resonator 108 and second resonator 110 on MEMS die 104.

Electronic circuitry 850 includes a first drive circuitry 806, a second drive circuitry 808, a digital converter circuitry 810, a temperature compensation circuitry 812, and a phase-locked loop (PLL) circuitry 814. In one or more examples, electronic circuitry 850 may be part of, or included in, an application-specific integrated circuit (ASIC). First drive circuitry 806 is to generate a first drive signal to drive first resonator 108 via at least a first drive electrode. The first drive signal may be driven at a first drive frequency. Second drive circuitry 808 is to generate a second drive signal to drive second resonator 110 via at least a second drive electrode. The second drive signal may be driven at a second drive frequency. In one or more examples, the second drive frequency is different from the first drive frequency.

In one or more examples, digital converter circuitry 810 may be or include a temperature-to-digital converter (TDC) circuitry. A TDC allows for a digital, very low-noise, high-resolution measurement of the temperature. Digital converter circuitry 810 is to receive first sense signal 182 from first resonator 108 via the at least first sense electrode and convert first sense signal 182 into first digital temperature data. First sense signal 182 has a first sense signal frequency, and the first digital temperature data represents a first temperature corresponding to the first sense signal frequency. Digital converter circuitry 810 is to receive second sense signal 192 from second resonator 110 via the at least second sense electrode and convert second sense signal 192 into second digital temperature data. Second sense signal 192 has a second sense signal frequency, and the second digital temperature data represents a second temperature corresponding to the second sense signal frequency.

In one or more examples, temperature compensation circuitry 812 is to generate an adjustment signal at least partially based on a ratio of changes in the first temperature (e.g., as represented by the first digital temperature data) and the second temperature (e.g., as represented by the second digital temperature data), respectively. PLL circuitry 814 is to adjust the first sense signal frequency of the first sense signal at least partially based on the adjustment signal for producing a temperature-compensated oscillator signal. In one or more examples, the resulting temperature-compensated oscillator signal has a relatively stable frequency over the predetermined temperature range.

FIG. 9 is a block diagram of an oscillator 900 that is known to the inventor of this disclosure. Oscillator 900 includes a MEMS die 904 attached to a CMOS die 902 via a die attachment 906. MEMS die 904 includes a resonator 908, and CMOS die 902 includes a temperature sensor 910 and a processing circuitry 912. Processing circuitry 912 is to receive and process a sense signal from resonator 908.

Processing circuitry 912 is to compensate a frequency of the sense signal from resonator 908 on MEMS die 904 based on temperature readings from temperature sensor 910 on CMOS die 902.

In oscillator 900 of FIG. 9, a limited thermal coupling exists between resonator 908 and temperature sensor 910. The temperature reading from temperature sensor 910 is largely correlated with a temperature on CMOS die 902, not necessarily with resonator 908 on MEMS die 904. Because a temperature offset exists between resonator 908 and temperature sensor 910, the temperature reading and resulting frequency adjustment may not be accurate. In addition, a thermal gradient that exists between resonator 908 and temperature sensor 910 causes their respective temperatures to be out-of-sync with each other, especially when undergoing relatively fast temperature transients. Because resonator 908 and temperature sensor 910 do not track equally, it is difficult to simultaneously read and correlate their respective temperatures. In addition, temperature sensor 910 is sensitive to many other environmental factors, such as aging and stress of CMOS die 902 and associated packaging. Furthermore, temperature sensor 910 may provide an analog output signal, which may be relatively noisy and require use of an ADC. In some cases, the ADC may have a limited number of ADC bits, which will undesirably limit the resolution of the temperature readout to result in compensation inaccuracies.

Again, in one or more examples, the first and the second resonators of the dual resonator structure have different frequency versus temperature profiles, at least partially based on engineering the directions of the acoustic wave vibration propagations and doping levels of the single crystal silicon. This is explained further in relation to FIGS. 10A-10B and 11A-11B.

FIG. 10A is a graph 1000A of a plot 1002 representing a relationship between a temperature coefficient of frequency (TCf) and a doping concentration for the first resonator (e.g., the reference resonator, without limitation), and a plot 1004 representing a relationship between a frequency variation and the doping concentration for the first resonator, according to one or more examples. The frequency variation is indicated in terms of parts-per-million (ppm), the TCf is indicated in terms of ppm over degrees Celsius (C) (ppm/C), and the doping concentration is indicated in cubic centimeters ($cm^3$).

Plots 1002 and 1004 are associated with first resonator 108 (e.g., FIGS. 2-3) (e.g., the reference resonator, without limitation) configured at an orientation angle of about 450 and having a resonating (reference) frequency of 42 MHz. Along plot 1002 of FIG. 10A, one or more data points (e.g., a data point 1005, without limitation) associated with a TCf of zero (or close to zero) are selected. Data point 1005 is indicated to correspond to a doping concentration of approximately $-7e19$ $cm^{-3}$. This optimal doping concentration of approximately $-7e19$ $cm^{-3}$ is indicated to correspond to a particular data point on plot 1004, and this data point is used as the basis for the corresponding plot of FIG. 10B.

FIG. 10B is a graph 1000B of a plot 1010 representing a relationship between a frequency change and a temperature for the first resonator (e.g., the reference resonator, without limitation). In one or more examples, a predetermined temperature range of the resonator structure is at least between about $-40$-$90°$ C. In one or more alternative examples, the predetermined temperature range may be at least between about $-20$-$70°$ C. In one or more examples, the predetermined temperature range of the resonator structure is an operating temperature range of a temperature-controlled oscillator including the resonator structure. As indicated in FIG. 10B, the frequency change or deviation from the reference frequency is approximately zero (~0 ppm) at room temperature (RT). Room temperature may be considered to be between $20°$ C. and $25°$ C. ($68°$ F. and $77°$ F.), with average room temperature being around $23°$ C. ($73°$ F.). This lowest frequency deviation (i.e., ~0 ppm) is indicated at a point 1012 on plot 1010, which is generally the vertex of plot 1010. Also as indicated in FIG. 10B, the change or delta in frequency over the (entire) predetermined temperature range is only about 139 ppm.

Hence, as described, the first resonator may exhibit a resonating frequency that is relatively (e.g., as compared to the second resonator) frequency-stable (e.g., temperature insensitive, without limitation) over the predetermined temperature range. The relative frequency-stability of the first resonator may be better observed in a plot 1110 of FIG. 11B, which better reveals the relative flatness of the frequency change over the predetermined temperature range (i.e., relative to the frequency-dependent nature of the second resonator in a plot 1112 of FIG. 11B).

In the specific, non-limiting example of FIG. 10B, the relative frequency-stability of the first resonator may be more specifically characterized by plot 1010 comprising a generally U-shaped or parabolic curve over the predetermined temperature range. In one or more examples of FIG. 10B, the generally U-shaped or parabolic curve has a downward opening. In one or more alternative examples, the generally U-shaped or parabolic curve may have an upward opening. In one or more examples, the generally U-shaped or parabolic curve has a vertex at about room temperature. In one or more examples, a resonator is generally frequency-stable if the change or delta in frequency over the predetermined temperature range is less than a predetermined amount. In one or more examples, the change or delta in frequency over the predetermined temperature range for frequency-stability is less than 200 ppm (e.g., over $-40$-$90°$ C.). In one or more alternative examples, the change or delta in frequency over the predetermined temperature range for frequency-stability is less than 600 ppm (e.g., over $-40$-$90°$ C.).

Thus, the first resonator may resonate at a first resonating frequency that is generally frequency-stable over the predetermined temperature range, but may (e.g., slightly) change generally parabolically as temperature increases over the predetermined temperature range according to a generally U-shaped or parabolic curve. The generally U-shaped or parabolic curve may have either a downwards opening or an upwards opening. In one or more examples, the generally U-shaped or parabolic curve has a vertex at about room temperature. In one or more examples, the first resonating frequency may exhibit a change or delta in frequency, generally parabolically, over the predetermined temperature range that is less than a predetermined amount (e.g., 200 ppm, or 600 ppm).

FIG. 11A is a graph 1100A of a plot 1102 representing a relationship between a TCf and a doping concentration for the second resonator (e.g., the temperature sensing resonator, without limitation), and a plot 1104 representing a relationship between a frequency variation and the doping concentration for the second resonator, according to one or more examples. In one or more examples, plots 1102 and 1104 are associated with the second resonator 110 (e.g., FIGS. 2-3) (e.g., the temperature sensing resonator, without limitation) configured at an orientation angle of about $0°$ and having a resonating frequency of 44 MHz. Along plot 1104, one or more data points (e.g., a data point 1105, without limitation) corresponding to the doping concentration of approximately −7e19 cm⁻³ are selected. The doping concentration of approximately −7e19 cm⁻³ is indicated to correspond to a particular data point on plot 1104, and this data point is used as the basis for the corresponding plot of FIG. 11B.

FIG. 11B is a graph 1100B of plot 1112 representing a relationship between a frequency change versus temperature for the second resonator (e.g., the temperature sensing resonator, without limitation), according to one or more examples. For the second resonator, the frequency change or deviation from the reference frequency at room temperature is about −12 ppm (which is extremely small). As indicated in FIG. 11B, the change or delta in frequency for the second resonator over the predetermined temperature range is about 1642 ppm. As is apparent, the second resonator exhibits a resonating frequency that is relatively (e.g., as compared to the first resonator) temperature-dependent (e.g., temperature sensitive, without limitation) over the predetermined temperature range.

In one or more examples, the second resonator exhibits a resonating frequency that (e.g., generally or monotonically) decreases (e.g., substantially linearly) as temperature increases over the predetermined temperature range. In one or more examples, the frequency versus temperature profile of the second resonator may be defined by a linear function having a negative slope. In one or more alternative examples, the second resonator exhibits a resonating frequency that (e.g., generally or monotonically) increases (e.g., substantially linearly) as temperature increases over the predetermined temperature range.

FIG. 11B also shows plot 1110 representing a relationship between a frequency change versus temperature for the first resonator (e.g., reference resonator, without limitation), according to one or more examples. Compare plot 1110 (e.g., relatively flat) of the first resonator with plot 1112 (e.g., linearly decreasing) of the second resonator.

In one or more examples, the first resonator may be generally frequency-stable relative to the second resonator if the change or delta in frequency over the predetermined temperature range for the first resonator is significantly or substantially less than the change or delta in frequency over the predetermined temperature range for the second resonator (e.g., by at least a predetermined amount). In one or more examples, the difference in respective changes or deltas in frequency over the predetermined temperature range between the first resonator and the second resonator is at least 1000 ppm (e.g., over −40-90° C.) (i.e., with the first resonator having the substantially comparatively less change or delta in frequency than the second resonator).

Again, in one or more examples, the first resonator and the second resonator are used together to produce a temperature-compensated oscillator signal. With reference to an indication of a temperature reading 1114 in FIG. 11B, a ratio of the frequency/temperature changes is computed. An adjustment signal is computed at least partially based on the ratio of the changes. The frequency of the sense signal from the first resonator (e.g., the reference resonator, without limitation) is adjusted at least partially based on the adjustment signal, for thereby producing the temperature-compensated oscillator signal.

FIG. 12 is a block diagram of a device 1200 that, in one or more examples, may be used to implement various functions, operations, acts, processes, or methods disclosed herein. Device 1200 includes one or more processors 1204 (sometimes referred to herein as "processors 1204") operably coupled to one or more apparatuses such as data storage devices (sometimes referred to herein as "storage 1206"), without limitation. Storage 1206 includes machine-executable code 1208 stored thereon (e.g., stored on a computer-readable memory, without limitation) and processors 1204 include logic circuitry 1210. Machine-executable code 1208 includes information describing functional elements that may be implemented by (e.g., performed by, without limitation) logic circuitry 1210. Logic circuitry 1210 implements (e.g., performs, without limitation) the functional elements described by machine-executable code 1208. Device 1200, when executing the functional elements described by machine-executable code 1208, should be considered as special purpose hardware may carry out the functional elements disclosed herein. In one or more examples, processors 1204 may perform the functional elements described by machine-executable code 1208 sequentially, concurrently (e.g., on one or more different hardware platforms, without limitation), or in one or more parallel process streams.

When implemented by logic circuitry 1210 of processors 1204, machine-executable code 1208 may adapt processors 1204 to perform operations of examples disclosed herein. For example, machine-executable code 1208 may adapt processors 1204 to perform at least a portion or a totality of the operations discussed in relation to electronic circuitry 850 of FIG. 8, without limitation.

Processors 1204 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer executes computing instructions (e.g., software code, without limitation) related to examples. It is noted that a general-purpose processor (may also be referred to herein as a host processor or simply a host) may be a microprocessor, but in the alternative, processors 1204 may include any conventional processor, controller, microcontroller, or state machine. Processors 1204 may also be implemented as a combination of computing devices, such as a combination of a DSP and a microprocessor, a plurality of microprocessors, one or more microprocessors in conjunction with a DSP core, or any other such configuration.

In one or more examples, storage 1206 includes volatile data storage (e.g., random-access memory (RAM), without limitation), non-volatile data storage (e.g., Flash memory, a hard disc drive, a solid-state drive, erasable programmable read-only memory (EPROM), without limitation). In one or more examples, processors 1204 and storage 1206 may be implemented into a single device (e.g., a semiconductor device product, a system on chip (SOC), without limitation). In one or more examples, processors 1204 and storage 1206 may be implemented into separate devices.

In one or more examples, machine-executable code 1208 may include computer-readable instructions (e.g., software code, firmware code, without limitation). By way of non-limiting example, the computer-readable instructions may be stored by storage 1206, accessed directly by processors 1204, and executed by processors 1204 using at least logic circuitry 1210. Also, by way of non-limiting example, the computer-readable instructions may be stored on storage 1206, transmitted to a memory device (not shown) for execution, and executed by processors 1204 using at least logic circuitry 1210. Accordingly, in one or more examples, logic circuitry 1210 includes electrically configurable logic circuitry.

In one or more examples, machine-executable code 1208 may describe hardware (e.g., circuitry, without limitation) to be implemented in logic circuitry 1210 to perform the functional elements. This hardware may be described at any of a variety of levels of abstraction, from low-level transistor layouts to high-level description languages. At a high-level of abstraction, a hardware description language (HDL) such as an Institute of Electrical and Electronics Engineers (IEEE) Standard hardware description language (HDL) may be used, without limitation. By way of non-limiting examples, VERILOG®, SYSTEMVERILOG™ or very large-scale integration (VLSI) hardware description language (VHDL™) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of logic circuitry 1210 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in one or more examples, machine-executable code 1208 may include an HDL, an RTL, a GL description, a mask level description, other hardware description, or any combination thereof.

In examples where machine-executable code 1208 includes a hardware description (at any level of abstraction), a system (not shown, but including storage 1206) may implement the hardware description described by machine-executable code 1208. By way of non-limiting example, processors 1204 may include a programmable logic device (e.g., an FPGA or a PLC, without limitation) and the logic circuitry 1210 may be electrically controlled to implement circuitry corresponding to the hardware description into logic circuitry 1210. Also, by way of non-limiting example, logic circuitry 1210 may include hard-wired logic manufactured by a manufacturing system (not shown but including storage 1206) according to the hardware description of machine-executable code 1208.

Regardless of whether machine-executable code 1208 includes computer-readable instructions or a hardware description, logic circuitry 1210 performs the functional elements described by machine-executable code 1208 when implementing the functional elements of machine-executable code 1208. It is noted that although a hardware description may not directly describe functional elements, a hardware description indirectly describes functional elements that the hardware elements described by the hardware description are capable of performing.

As used herein, the term "substantially" in reference to a given parameter, property, or condition means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, or even at least about 99% met.

As used in the present disclosure, the terms "module" or "component" may refer to specific hardware implementations may perform the actions of the module or component or software objects or software routines that may be stored on or executed by general purpose hardware (e.g., computer-readable media, processing devices, without limitation) of the computing system. In one or more examples, the different components, modules, engines, and services described in the present disclosure may be implemented as objects or processes that execute on the computing system (e.g., as separate threads, without limitation). While some of the system and methods described in the present disclosure are generally described as being implemented in software (stored on or executed by general purpose hardware), specific hardware implementations or a combination of software and specific hardware implementations are also possible and contemplated.

As used in the present disclosure, the term "combination" with reference to a plurality of elements may include a combination of all the elements or any of various different sub-combinations of some of the elements. For example, the phrase "A, B, C, D, or combinations thereof" may refer to any one of A, B, C, or D; the combination of each of A, B, C, and D; and any sub-combination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," without limitation). As used herein, "each" means "some or a totality." As used herein, "each and every" means "a totality."

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" or "an" means "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, without limitation" or "one or more of A, B, and C, without limitation." is used, in general such a construction is intended to include A alone, B alone, C alone, A and B together, A and C together, B and C together, or A, B, and C together, without limitation.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated examples, those of ordinary skill in the art will recognize and appreciate that the present invention is not so limited. Rather, many additions, deletions, and modifications to the illustrated and described examples may be made without departing from the scope of the invention as hereinafter claimed along with their legal equivalents. In addition, features from one example may be combined with features of another example while still being encompassed within the scope of the invention as contemplated by the inventor.

A non-exhaustive, non-limiting list of examples follows. Not each of the examples listed below is explicitly and individually indicated as being combinable with all others of the examples listed below and examples discussed above. It is intended, however, that these examples are combinable with all other examples unless it would be apparent to one of ordinary skill in the art that the examples are not combinable.

Example 1: An apparatus comprising: a microelectromechanical system including a semiconductor body, the semiconductor body comprising: a first resonator, the first resonator to resonate at a first resonating frequency that is generally frequency-stable over a predetermined temperature range; a second resonator, the second resonator to resonate at a second resonating frequency that is generally linearly decreasing or increasing as temperature increases over the predetermined temperature range; and a supporting portion, the supporting portion to support both the first resonator and the second resonator.

Example 2: The apparatus according to Example 1, wherein: the first resonator has a first temperature coefficient of frequency; and the second resonator has a second temperature coefficient of frequency, the second temperature coefficient of frequency different from the first temperature coefficient of frequency.

Example 3: The apparatus according to any of Examples 1 and 2, wherein: the first resonator comprises a reference resonator; the second resonator comprises a temperature sensing resonator; and the supporting portion mechanically and thermally couples the first resonator and the second resonator.

Example 4: The apparatus according to any of Examples 1 through 3, wherein the semiconductor body comprises: at least one first drive electrode of the first resonator; at least one first sense electrode of the first resonator; at least one second drive electrode of the second resonator; and at least one second sense electrode of the second resonator.

Example 5: The apparatus according to any of Examples 1 through 4, wherein: respective ones of one or more resonating portions of the first resonator has a first shape and a first size; respective ones of one or more resonating portions of the second resonator has a second shape and a second size; the second shape is substantially the same as the first shape; and the second size is substantially the same as the first size.

Example 6: The apparatus according to any of Examples 1 through 5, wherein the first resonator and the second resonator are substantially symmetric about a lateral axis of the semiconductor body.

Example 7: The apparatus according to any of Examples 1 through 6, wherein the first resonator and the second resonator are orientated at a differential orientation angle with respect to one another.

Example 8: The apparatus according to any of Examples 1 through 7, wherein: the first resonator resonates at the first resonating frequency to exhibit a first acoustic wave propagation in a first direction; the second resonator resonates at the second resonating frequency to exhibit a second acoustic wave propagation in a second direction; and the first direction and the second direction are non-parallel.

Example 9: The apparatus according to any of Examples 1 through 8, wherein the differential orientation angle is about 45°.

Example 10: The apparatus according to any of Examples 1 through 9, wherein: the first resonator is to resonate at the first resonating frequency that changes generally parabolically as temperature increases over the predetermined temperature range according to a generally U-shaped or parabolic curve, the generally U-shaped or parabolic curve having one of a downwards opening or an upwards opening, the generally U-shaped or parabolic curve having a vertex at about room temperature.

Example 11: The apparatus according to any of Examples 1 through 10, wherein the first resonating frequency exhibits a change or delta in frequency over the predetermined temperature range that is less than a predetermined amount.

Example 12: The apparatus according to any of Examples 1 through 11, wherein the predetermined amount is 600 parts-per-million over the predetermined temperature range of –40-90° C.

Example 13: The apparatus according to any of Examples 1 through 12, wherein the second resonator is to resonate at the second resonating frequency that is generally linearly decreasing as temperature increases over the predetermined temperature range.

Example 14: The apparatus according to any of Examples 1 through 13, wherein the semiconductor body comprises a single crystal silicon.

Example 15: The apparatus according to any of Examples 1 through 14, comprising: a single die comprising the semiconductor body.

Example 16: The apparatus according to any of Examples 1 through 15, wherein respective ones of the first resonator and the second resonator comprise a dual-ring resonator including a first ring, a second ring, and a coupling beam to couple the first ring and the second ring.

Example 17: The apparatus according to any of Examples 1 through 16, wherein respective ones of the first resonator and the second resonator comprise a ring resonator, a disc resonator, a square plate resonator, a clamped-clamped resonator, a cantilever resonator, a fixed-fixed beam resonator, and a comb drive resonator.

Example 18: An apparatus comprising: an oscillator comprising: a microelectromechanical system including a semiconductor body, the semiconductor body comprising: a first resonator, the first resonator to resonate at a first resonating frequency that is generally frequency-stable over a predetermined temperature range; at least one first drive electrode of the first resonator; at least one first sense electrode of the first resonator; a second resonator, the second resonator to resonate at a second resonating frequency that is generally linearly decreasing or increasing as temperature increases over the predetermined temperature range; at least one second drive electrode of the second resonator; at least one second sense electrode of the second resonator; and a supporting portion to support both the first resonator and the second resonator.

Example 19: The apparatus according to Example 18, wherein the microelectromechanical system is on a first die, the apparatus comprising: the oscillator comprising: an electronic circuitry, the electronic circuitry on a second die attached to the first die, the electronic circuitry comprising: a first drive circuitry, the first drive circuitry to generate a first drive signal to drive the first resonator via the at least one first drive electrode, the first drive signal having a first drive frequency; a second drive circuitry, the second drive circuitry to generate a second drive signal to drive the second resonator via the at least one second drive electrode, the second drive signal having a second drive frequency; a digital converter circuitry, the digital converter circuitry to receive a first sense signal from the first resonator via the at least one first sense electrode and to convert the first sense signal into first digital temperature data, the first sense signal having a first sense signal frequency and the first digital temperature data to represent a first temperature corresponding to the first sense signal frequency; and the digital converter circuitry to receive a second sense signal from the second resonator via the at least one second sense electrode and to convert the second sense signal into second digital temperature data, the second sense signal having a second sense signal frequency and the second digital temperature data to represent a second temperature corresponding to the second sense signal frequency.

Example 20: The apparatus according to any of Examples 18 and 19, comprising: the electronic circuitry comprising: a temperature compensation circuitry, the temperature compensation circuitry to generate an adjustment signal at least partially based on a ratio of changes in the first temperature represented by the first digital temperature data and the second temperature represented by the second digital temperature data, respectively; and a phase-lock-loop circuitry, the phase-lock-loop circuitry to adjust the first sense signal frequency at least partially based on the adjustment signal for producing a temperature-compensated oscillator signal.

Example 21: The apparatus according to any of Examples 18 through 20, wherein the digital converter circuitry comprises a temperature-to-digital converter (TDC).

Example 22: The apparatus according to any of Examples 18 through 21, wherein the supporting portion mechanically and thermally couples the first resonator and the second resonator.

Example 23: The apparatus according to any of Examples 18 through 22, wherein: respective ones of one or more resonating portions of the first resonator have a first shape and a first size; respective ones of one or more resonating portions of the second resonator have a second shape and a second size; the second shape is substantially the same as the first shape; and the second size is substantially the same as the first size.

Example 24: The apparatus according to any of Examples 18 through 23, wherein the first resonator and the second resonator are substantially symmetric about a lateral axis of the semiconductor body.

Example 25: The apparatus according to any of Examples 18 through 24, wherein the first resonator and the second resonator are orientated at a differential orientation angle with respect to one another.

Example 26: The apparatus according to any of Examples 18 through 25, wherein: the first resonator resonates at the first resonating frequency to exhibit a first acoustic wave propagation in a first direction; the second resonator resonates at the second resonating frequency to exhibit a second acoustic wave propagation in a second direction; and the first direction and the second direction are non-parallel.

Example 27: The apparatus according to any of Examples 18 through 26, wherein the differential orientation angle is about 45°.

Example 28: The apparatus according to any of Examples 18 through 27, wherein the first resonating frequency exhibits a change or delta in frequency over the predetermined temperature range that is less than a predetermined amount.

Example 29: The apparatus according to any of Examples 18 through 28, wherein the semiconductor body comprises a single crystal silicon.

Example 30: The apparatus according to any of Examples 18 through 29, wherein respective ones of the first resonator and the second resonator comprise a dual-ring resonator including a first ring, a second ring, and a coupling beam to couple the first ring and the second ring.

Example 31: The apparatus according to any of Examples 18 through 30, wherein the oscillator comprises a temperature-controlled oscillator.

Example 32: An apparatus comprising: a micromechanical system including a semiconductor body, the semiconductor body comprising: a first dual-ring resonator, the first dual-ring resonator to resonate at a first resonating frequency that is generally frequency-stable over a predetermined temperature range; a second dual-ring resonator, the second dual-ring resonator to resonate at a second resonating frequency that is generally linearly decreasing or increasing as temperature increases over the predetermined temperature range; and a supporting portion, the supporting portion to support both the first dual-ring resonator and the second dual-ring resonator, the supporting portion comprising a generally rectangular body having at least one bend to provide a differential orientation angle between the first dual-ring resonator and the second dual-ring resonator.

Example 33: The apparatus according to Example 32, wherein: respective ones of one or more resonating portions of the first dual-ring resonator have a first shape and a first size; respective ones of one or more resonating portions of the second dual-ring resonator have a second shape and a second size; the second shape is substantially the same as the first shape; the second size is substantially the same as the first size; and the first dual-ring resonator and the second dual-ring resonator are substantially symmetric about a lateral axis of the semiconductor body.

Example 34: The apparatus according to any of Examples 32 and 33, wherein: the first dual-ring resonator resonates at the first resonating frequency to exhibit a first acoustic wave propagation in a first direction; the second dual-ring resonator resonates at the second resonating frequency to exhibit a second acoustic wave propagation in a second direction; and the first direction and the second direction are non-parallel.

Example 35: The apparatus according to any of Examples 32 through 34, wherein: the first dual-ring resonator is to resonate at the first resonating frequency that is generally frequency-stable but changes generally parabolically as temperature increases over the predetermined temperature range according to a generally U-shaped or parabolic curve, the generally U-shaped or parabolic curve having one of a downwards opening or an upwards opening, the generally U-shaped or parabolic curve having a vertex at about room temperature, the first resonating frequency exhibiting a change or delta in frequency over the predetermined temperature range that is less than a predetermined amount.

What is claimed is:

1. An apparatus comprising:
   a microelectromechanical system including a semiconductor body, the semiconductor body comprising:
   a first resonator, the first resonator including first resonating portions to resonate at a first resonating frequency that is generally frequency-stable over a predetermined temperature range;
   a second resonator, the second resonator including second resonating portions to resonate at a second resonating frequency that is generally linearly decreasing or increasing as temperature increases over the predetermined temperature range; and
   a supporting portion, the supporting portion to support both the first resonator and the second resonator, the supporting portion including a first connecting portion to the first resonator and a second connecting portion to the second resonator, the first connecting portion surrounding respective portions of respective perimeters of the first resonating portions of the first resonator, the second connecting portion surrounding respective portions of respective perimeters of the second resonating portions of the second resonator.

2. The apparatus of claim 1, wherein:
   the first resonator has a first temperature coefficient of frequency; and
   the second resonator has a second temperature coefficient of frequency, the second temperature coefficient of frequency different from the first temperature coefficient of frequency.

3. The apparatus of claim 1, wherein:
   the first resonator comprises a reference resonator;
   the second resonator comprises a temperature sensing resonator; and
   the supporting portion mechanically and thermally couples the first resonating portions of the first resonator and the second resonating portions of the second resonator.

4. The apparatus of claim 1, wherein the semiconductor body comprises:
   at least one first drive electrode of the first resonator;
   at least one first sense electrode of the first resonator;
   at least one second drive electrode of the second resonator; and
   at least one second sense electrode of the second resonator.

5. The apparatus of claim 1, wherein:
   respective ones of the first resonating portions of the first resonator have a first shape and a first size;
   respective ones of the second resonating portions of the second resonator have a second shape and a second size;
   the second shape is substantially the same as the first shape; and
   the second size is substantially the same as the first size.

6. The apparatus of claim 5, wherein the first resonator and the second resonator are substantially symmetric about a lateral axis of the semiconductor body.

7. The apparatus of claim 1, wherein the first resonator and the second resonator are orientated at a differential orientation angle with respect to one another.

8. The apparatus of claim 7, wherein:
   the first resonating portions of the first resonator resonate at the first resonating frequency to exhibit a first acoustic wave propagation in a first direction;
   the second resonating portions of the second resonator resonate at the second resonating frequency to exhibit a second acoustic wave propagation in a second direction; and
   the first direction and the second direction are non-parallel.

9. The apparatus of claim 1, comprising:
   a single supporting anchor to anchor the semiconductor body, the single supporting anchor in substantially a center of the supporting portion.

10. The apparatus of claim 1, wherein the first connecting portion surrounds about twenty-five (25) percent or more of the respective portions of the respective perimeters of the first resonating portions of the first resonator, and the second connecting portion surrounds about twenty-five (25) percent or more of the respective portions of the respective perimeters of the second resonating portions of the second resonator.

11. The apparatus of claim 10, wherein the first resonating frequency exhibits a change or delta in frequency over the predetermined temperature range that is less than a predetermined amount.

12. The apparatus of claim 11, wherein the predetermined amount is 600 parts-per-million over the predetermined temperature range of −40-90° C.

13. The apparatus of claim 1, wherein the second resonating portions of the second resonator are to resonate at the second resonating frequency that is generally linearly decreasing as temperature increases over the predetermined temperature range.

14. The apparatus of claim 1, wherein the semiconductor body comprises a single crystal silicon.

15. The apparatus of claim 1, comprising:
   a single die comprising the semiconductor body.

16. The apparatus of claim 1, wherein respective ones of the first resonator and the second resonator comprise a dual-ring resonator including a first ring, a second ring, and a coupling beam to couple the first ring and the second ring.

17. The apparatus of claim 1, wherein respective ones of the first resonator and the second resonator comprise a ring resonator, a disc resonator, a square plate resonator, a clamped-clamped resonator, a cantilever resonator, a fixed-fixed beam resonator, and a comb drive resonator.

18. An apparatus comprising:
   an oscillator comprising:
   a microelectromechanical system including a semiconductor body, the semiconductor body comprising:
   a first resonator, the first resonator including first resonating portions to resonate at a first resonating frequency that is generally frequency-stable over a predetermined temperature range;
   at least one first drive electrode of the first resonator;
   at least one first sense electrode of the first resonator;
   a second resonator, the second resonator including second resonating portions to resonate at a second resonating frequency that is generally linearly decreasing or increasing as temperature increases over the predetermined temperature range;
   at least one second drive electrode of the second resonator;

at least one second sense electrode of the second resonator; and a supporting portion to support both the first resonator and the second resonator, the supporting portion including a first connecting portion to the first resonator and a second connecting portion to the second resonator, the first connecting portion surrounding respective portions of respective perimeters of the first resonating portions of the first resonator, the second connecting portion surrounding respective portions of respective perimeters of the second resonating portions of the second resonator.

19. The apparatus of claim 18, wherein the microelectromechanical system is on a first die, the apparatus comprising:

the oscillator comprising:

an electronic circuitry, the electronic circuitry on a second die attached to the first die, the electronic circuitry comprising:

a first drive circuitry, the first drive circuitry to generate a first drive signal to drive the first resonator via the at least one first drive electrode, the first drive signal having a first drive frequency;

a second drive circuitry, the second drive circuitry to generate a second drive signal to drive the second resonator via the at least one second drive electrode, the second drive signal having a second drive frequency;

a digital converter circuitry, the digital converter circuitry to receive a first sense signal from the first resonator via the at least one first sense electrode and to convert the first sense signal into first digital temperature data, the first sense signal having a first sense signal frequency and the first digital temperature data to represent a first temperature corresponding to the first sense signal frequency; and the digital converter circuitry to receive a second sense signal from the second resonator via the at least one second sense electrode and to convert the second sense signal into second digital temperature data, the second sense signal having a second sense signal frequency and the second digital temperature data to represent a second temperature corresponding to the second sense signal frequency.

20. The apparatus of claim 19, comprising:

the electronic circuitry comprising:

a temperature compensation circuitry, the temperature compensation circuitry to generate an adjustment signal at least partially based on a ratio of changes in the first temperature represented by the first digital temperature data and the second temperature represented by the second digital temperature data, respectively; and a phase-lock-loop circuitry, the phase-lock-loop circuitry to adjust the first sense signal frequency at least partially based on the adjustment signal for producing a temperature-compensated oscillator signal.

21. The apparatus of claim 18, wherein the first connecting portion surrounds about twenty-five (25) percent or more of the respective portions of the respective perimeters of the first resonating portions of the first resonator, and the second connecting portion surrounds about twenty-five (25) percent or more of the respective portions of the respective perimeters of the second resonating portions of the second resonator.

22. The apparatus of claim 18, wherein the supporting portion mechanically and thermally couples the first resonating portions of the first resonator and the second resonating portions of the second resonator.

23. The apparatus of claim 18, wherein:

respective ones of the first resonating portions of the first resonator have a first shape and a first size;

respective ones of the second resonating portions of the second resonator have a second shape and a second size;

the second shape is substantially the same as the first shape; and the second size is substantially the same as the first size.

24. The apparatus of claim 23, wherein the first resonator and the second resonator are substantially symmetric about a lateral axis of the semiconductor body.

25. The apparatus of claim 18, wherein the first resonator and the second resonator are orientated at a differential orientation angle with respect to one another.

26. The apparatus of claim 25, wherein:

the first resonating portions of the first resonator resonate at the first resonating frequency to exhibit a first acoustic wave propagation in a first direction;

the second resonating portions of the second resonator resonate at the second resonating frequency to exhibit a second acoustic wave propagation in a second direction; and the first direction and the second direction are non-parallel.

27. The apparatus of claim 25, wherein the differential orientation angle is about 45°.

28. The apparatus of claim 18, wherein the first resonating frequency exhibits a change or delta in frequency over the predetermined temperature range that is less than a predetermined amount.

29. The apparatus of claim 18, wherein the semiconductor body comprises a single crystal silicon.

30. The apparatus of claim 18, wherein respective ones of the first resonator and the second resonator comprise a dual-ring resonator including a first ring, a second ring, and a coupling beam to couple the first ring and the second ring.

31. The apparatus of claim 18, comprising:

a single supporting anchor to anchor the semiconductor body, the single supporting anchor in substantially a center of the supporting portion.

32. An apparatus comprising:

a micromechanical system including a semiconductor body, the semiconductor body comprising:

a first dual-ring resonator, the first dual-ring resonator to resonate at a first resonating frequency that is generally frequency-stable over a predetermined temperature range;

a second dual-ring resonator, the second dual-ring resonator to resonate at a second resonating frequency that is generally linearly decreasing or increasing as temperature increases over the predetermined temperature range; and a supporting portion, the supporting portion to support both the first dual-ring resonator and the second dual-ring resonator, the supporting portion comprising a generally rectangular body having at least one bend to provide a differential orientation angle between the first dual-ring resonator and the second dual-ring resonator.

33. The apparatus of claim 32, wherein:

respective ones of one or more resonating portions of the first dual-ring resonator have a first shape and a first size;

respective ones of one or more resonating portions of the second dual-ring resonator have a second shape and a second size;

the second shape is substantially the same as the first shape;

the second size is substantially the same as the first size; and the first dual-ring resonator and the second dual-ring resonator are substantially symmetric about a lateral axis of the semiconductor body.

34. The apparatus of claim 33, wherein:

the first dual-ring resonator resonates at the first resonating frequency to exhibit a first acoustic wave propagation in a first direction;

the second dual-ring resonator resonates at the second resonating frequency to exhibit a second acoustic wave propagation in a second direction; and the first direction and the second direction are non-parallel.

35. The apparatus of claim 32, wherein the first dual-ring resonator includes first and second rings, the second dual-ring resonator includes first and second rings, and the supporting portion includes a first connecting portion to the first dual-ring resonator and a second connecting portion to the second resonator, the first connecting portion surrounding about twenty-five (25) percent or more of respective portions of respective perimeters of the first and the second rings of the first dual-ring resonator, the second connecting portion surrounding about twenty-five (25) percent or more of respective portions of respective perimeters of the first and the second rings of the second resonator.

* * * * *